United States Patent
Burward-Hoy

[11] Patent Number: 5,977,785
[45] Date of Patent: Nov. 2, 1999

[54] METHOD AND APPARATUS FOR RAPIDLY VARYING THE OPERATING TEMPERATURE OF A SEMICONDUCTOR DEVICE IN A TESTING ENVIRONMENT

[76] Inventor: Trevor Burward-Hoy, 10384 Dempster Ave., Cupertino, Calif. 95014

[21] Appl. No.: 08/654,311

[22] Filed: May 28, 1996

[51] Int. Cl.⁶ .............................. F25B 29/00; F28F 7/00; G01R 31/00
[52] U.S. Cl. ...................... 324/760; 165/80.2; 165/201; 165/260; 73/863.11; 374/135
[58] Field of Search .................... 324/760, 765; 165/11.1, 201, 253, 260, 80.2; 73/863.11; 374/135

[56] References Cited

U.S. PATENT DOCUMENTS

| | | | |
|---|---|---|---|
| 3,249,864 | 5/1966 | Seney | 324/61 |
| 3,648,167 | 3/1972 | Purdy et al. | 324/158 |
| 3,710,251 | 1/1973 | Hagge et al. | 324/158 |
| 3,756,903 | 9/1973 | Jones | 161/39 |
| 3,842,346 | 10/1974 | Bobbitt | 324/73 |
| 4,324,285 | 4/1982 | Henderson | 165/2 |
| 4,381,814 | 5/1983 | Funk | 165/1 |
| 4,458,747 | 7/1984 | Berry et al. | 165/104.29 |
| 4,567,432 | 1/1986 | Buol et al. | 324/158 |
| 4,604,572 | 8/1986 | Horiuchi et al. | 324/158 |
| 4,757,255 | 7/1988 | Margozzi | 324/158 |
| 4,848,090 | 7/1989 | Peters | 165/27 X |
| 5,006,796 | 4/1991 | Burton et al. | 324/158 |
| 5,034,688 | 7/1991 | Moulene et al. | 324/158 |
| 5,077,523 | 12/1991 | Blanz | 324/158 |
| 5,084,671 | 1/1992 | Miyata et al. | 324/158 |
| 5,086,269 | 2/1992 | Nobi | 324/158 |
| 5,097,207 | 3/1992 | Blanz | 324/158 |
| 5,126,656 | 6/1992 | Jones | 324/158 |
| 5,160,883 | 11/1992 | Blanz | 324/158 |
| 5,164,661 | 11/1992 | Jones | 324/158 |
| 5,198,752 | 3/1993 | Miyata et al. | 324/158 |
| 5,315,240 | 5/1994 | Jones | 324/158 |
| 5,325,052 | 6/1994 | Yamashita | 324/158 |
| 5,335,708 | 8/1994 | Murakami et al. | 165/1 |
| 5,355,938 | 10/1994 | Hosoya et al. | 165/12 |
| 5,394,937 | 3/1995 | Nieh | 165/156 |
| 5,420,521 | 5/1995 | Jones | 324/760 |
| 5,489,851 | 2/1996 | Heumann et al. | 324/537 |
| 5,568,054 | 10/1996 | Iino et al. | 324/760 |
| 5,735,339 | 4/1998 | Davenport et al. | 165/80.1 |
| 5,775,416 | 7/1998 | Heimanson et al. | 165/275 |

FOREIGN PATENT DOCUMENTS 1-303733  12/1989  Japan ............................. H01L 21/66

*Primary Examiner*—Glenn W. Brown
*Attorney, Agent, or Firm*—Fliesler, Dubb, Meyer & Lovejoy LLP

[57] ABSTRACT

An apparatus for varying a temperature of a device under test (DUT). The apparatus comprises a plate having a surface area configured to couple to the DUT to transfer heat to and from the DUT by way of conduction. A heat exchanger is connected to the plate to set a temperature of the surface area of the plate to one of a range of temperatures by way of conduction. The heat exchanger circulates a plurality of fluids that each have a different nominal temperature, and the flow rates of the fluids are adjustable to vary the temperature of the surface area of the plate, thereby varying the temperature of the DUT.

23 Claims, 23 Drawing Sheets

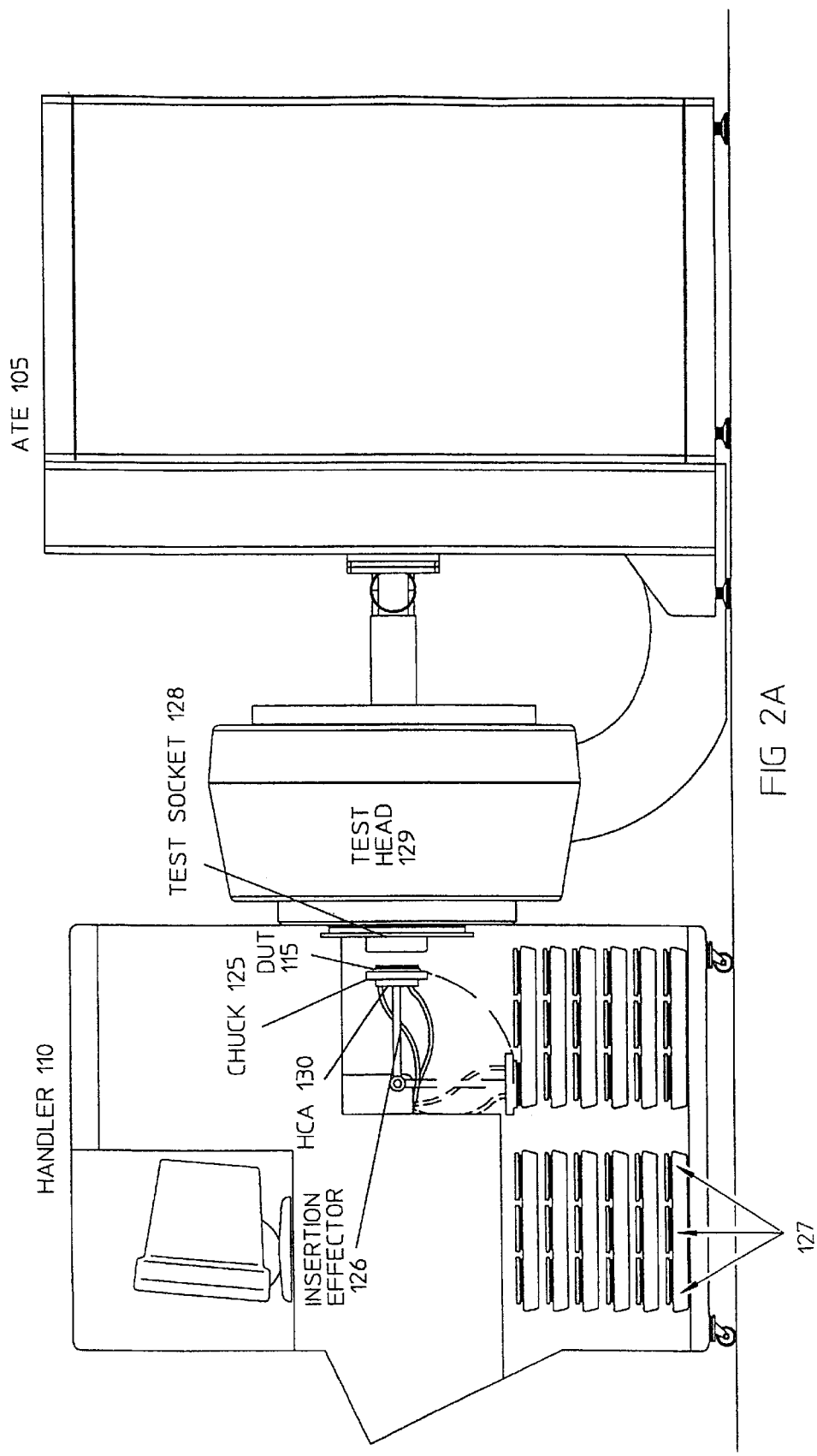

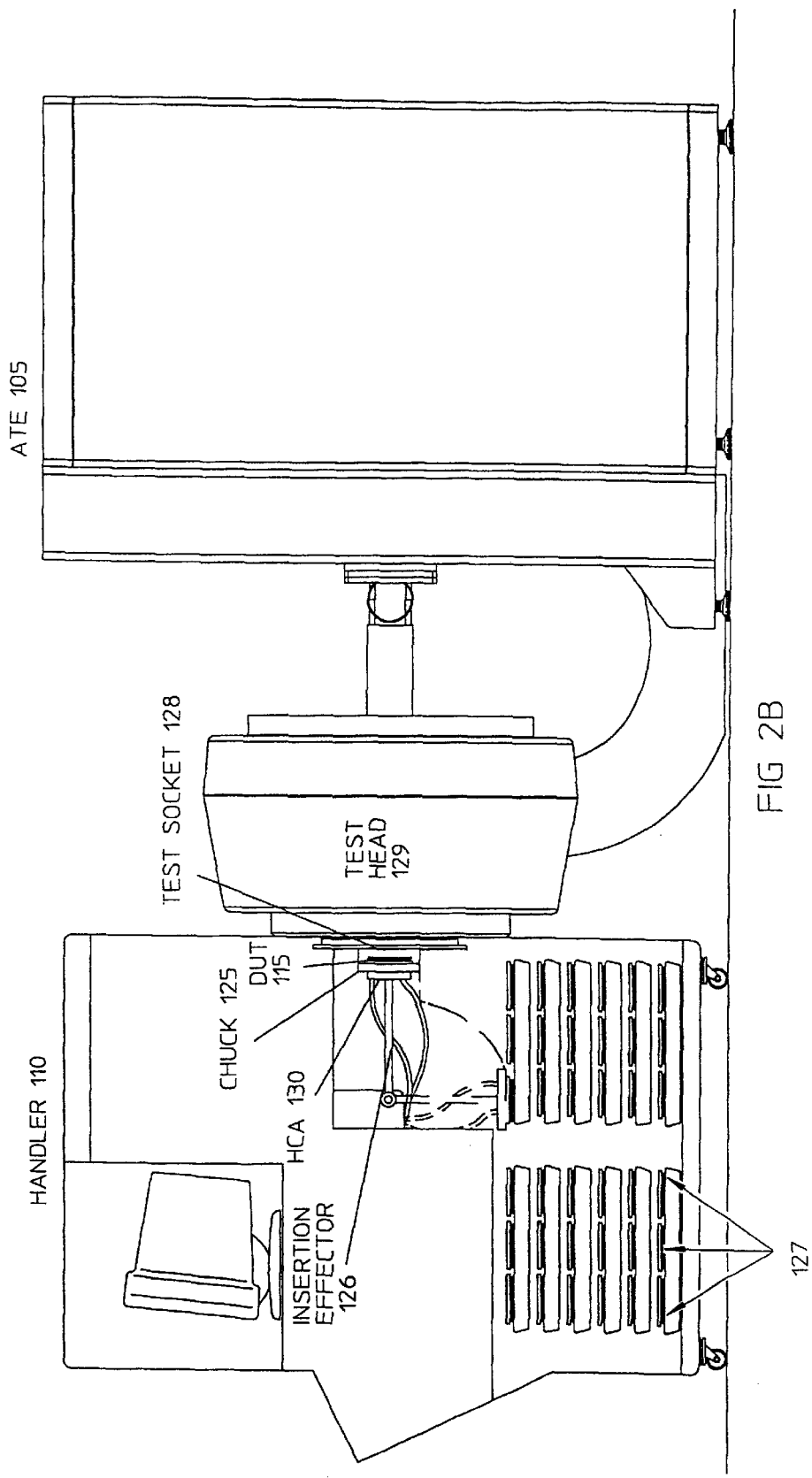

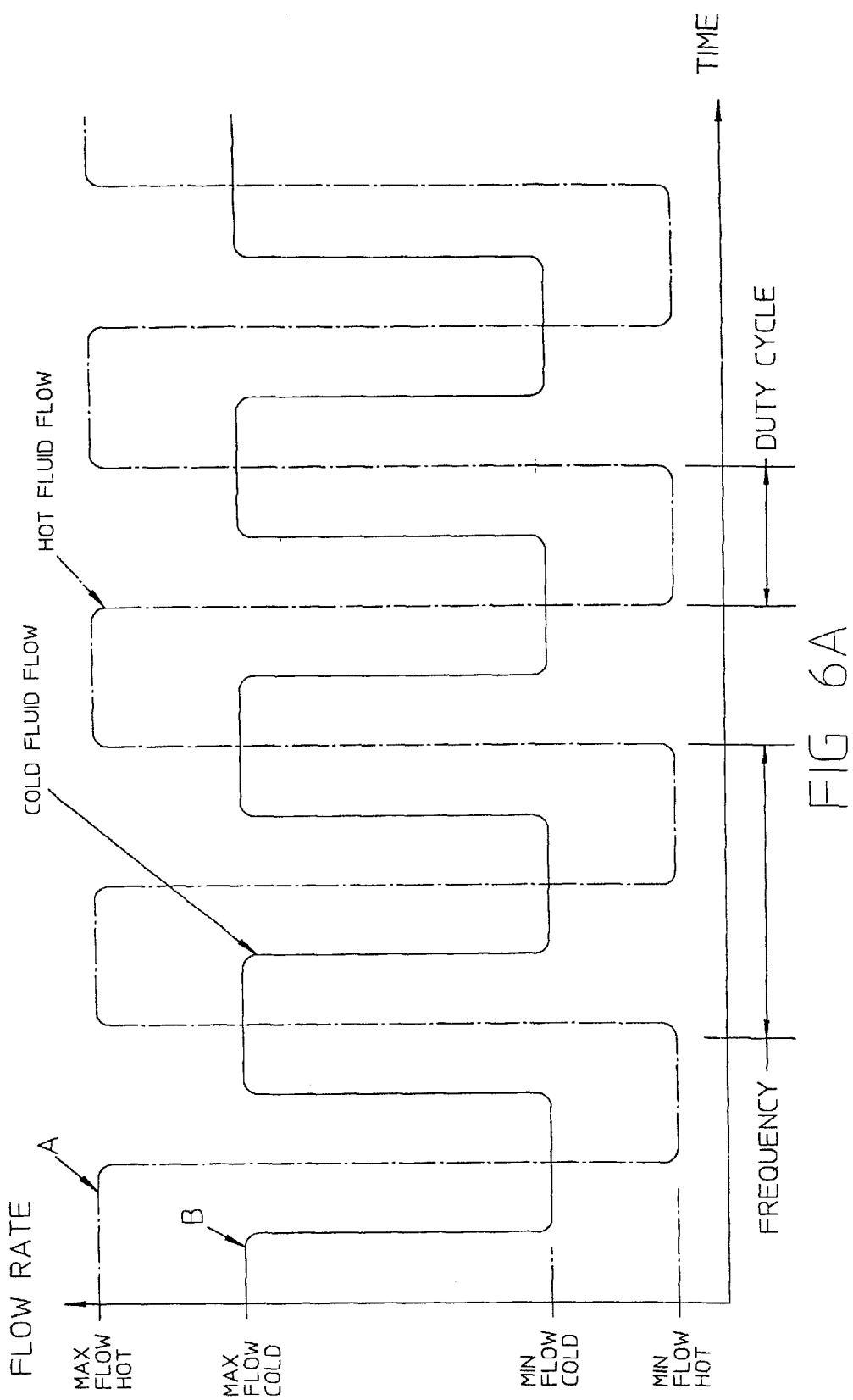

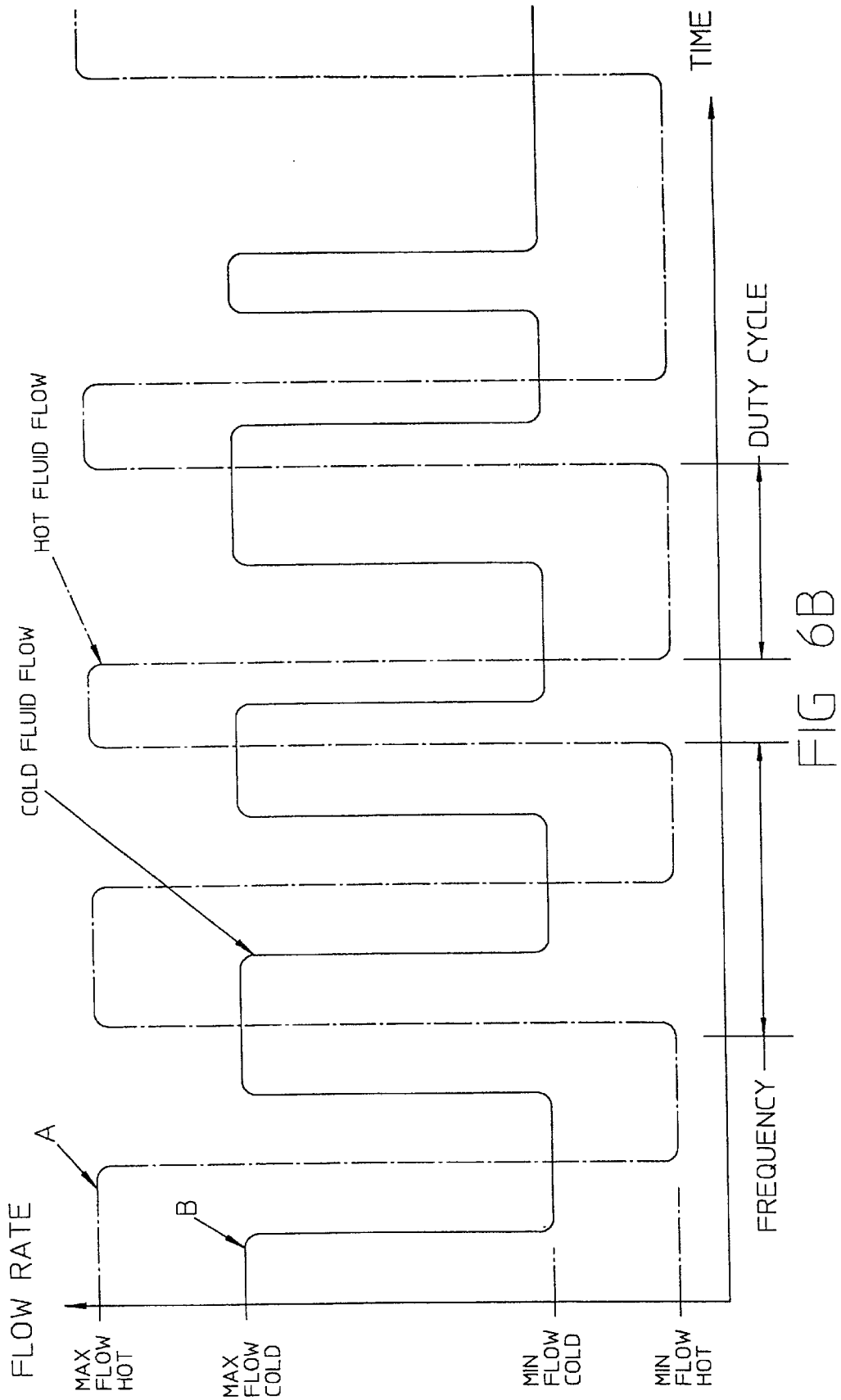

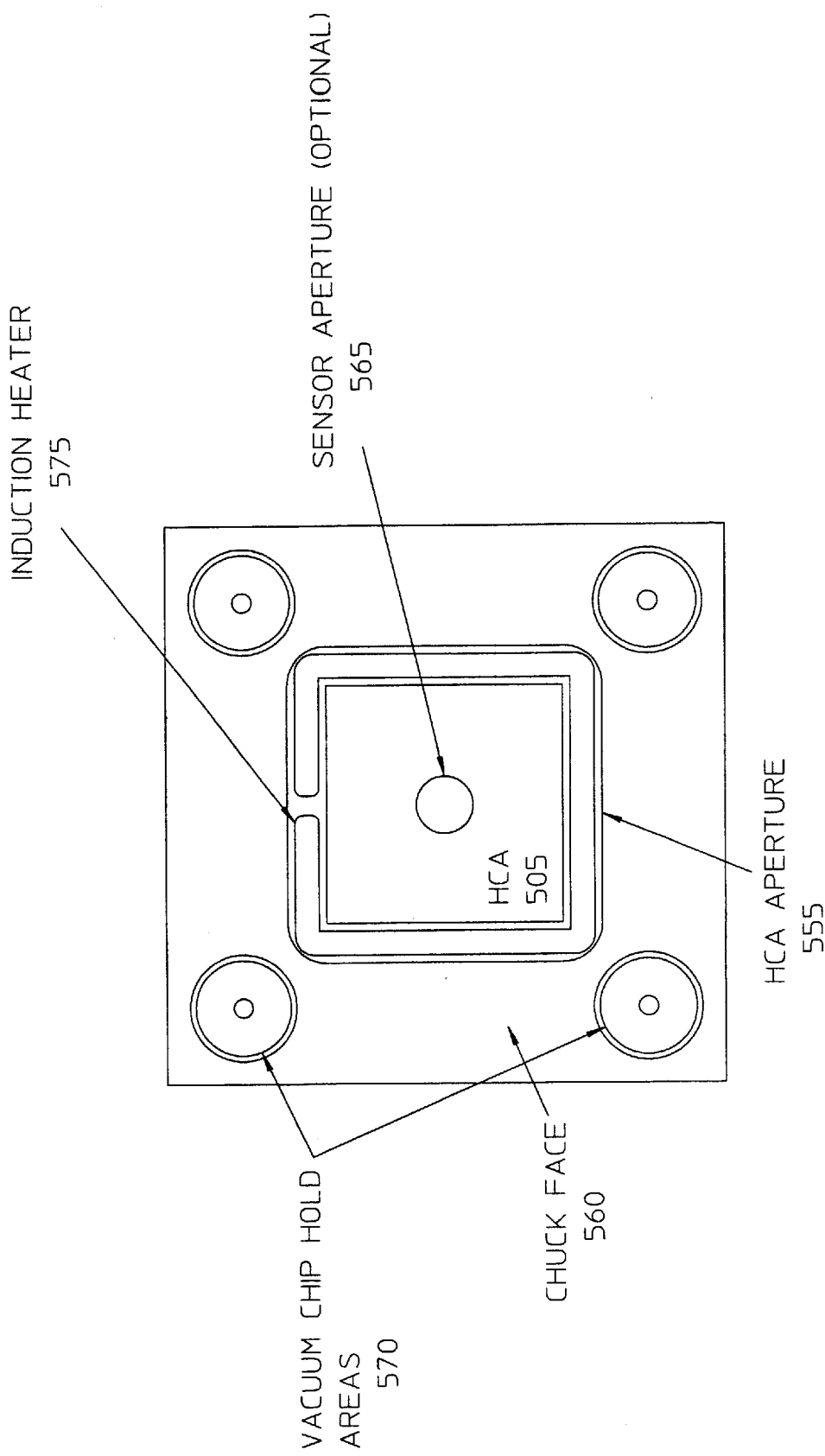

METHOD AND APPARATUS FOR RAPIDLY VARYING THE OPERATING TEMPERATURE OF A SEMICONDUCTOR DEVICE IN A TESTING ENVIRONMENT

FIELD OF THE INVENTION

The present invention relates generally to heat transfer and more particularly to a method and apparatus for rapidly varying the operating temperature of a semiconductor device in a testing environment.

BACKGROUND

Semiconductor devices, such as microprocessors, memory devices, and other integrated circuit (IC) devices, are subjected to rigorous electrical or "functional" testing in order to ensure proper operation over a specified range of possible operating conditions. One operating condition that is of particular concern is the operating temperature of the semiconductor device, and one type of testing, often called "temperature binning," requires performing a particular set of tests at each of a multiplicity of different operating temperatures For example, a semiconductor device might be tested at room temperature (ambient), at a specified minimum operating temperature (e.g., −50 degrees Celsius), and at a specified maximum operating temperature (e.g., 200 degrees Celsius). Devices are often sorted based on the results of the temperature binning tests.

According to typical prior techniques, temperature binning requires a device under test (DUT) to be cycled through the test system for each operating temperature tested, which is inefficient. For example, a typical test system includes a test head having a test socket for receiving a DUT, a handler for conveying the DUT through the test system, and one or more heating and/or cooling stations for heating or cooling the DUT to a specified temperature. For such a system, the handler inserts the DUT for testing at a first temperature, removes the DUT so that the DUT may be heated or cooled to a second temperature, and then reinserts the DUT for testing at the second temperature, repeating the process for each new test temperature.

The process of repeatedly inserting and removing a DUT from a test head so the DUT may be heated or cooled requires a considerable amount of time and therefore reduces the rate at which DUTs may be tested and sorted. It would be desirable to reduce test time by reducing the need to remove the DUT from a test head, once inserted

SUMMARY AND OBJECTS OF THE INVENTION

Therefore, it is an object of the present invention to reduce the time required to test semiconductor devices.

It is a further object of the invention to provide an apparatus for varying the operating temperature of a DUT while the DUT is positioned for testing.

These and other objects of the invention are provided by an apparatus for varying a temperature of a device under test (DUT). The apparatus comprises a plate having a surface area configured to couple to the DUT to transfer heat to and from the DUT by way of conduction. A heat exchanger is connected to the plate to set a temperature of the surface area of the plate to one of a range of temperatures by way of conduction. The heat exchanger circulates a plurality of fluids that each have a different nominal temperature, and the flow rates of the fluids are adjustable to vary the temperature of the surface area of the plate, thereby varying the temperature of the DUT.

Other objects, features, and advantages of the present invention will be apparent in view of the following detailed description and the accompanying drawings.

BRIEF DESCRIPTION OF THE DRAWINGS

The objects, features, and advantages of the present invention will be apparent from the following detailed description in which:

FIGS. 2A and 2B show a heating and cooling apparatus of one embodiment being integrated into the handler of a test system and into the automatic test equipment of a test system, respectively.

FIGS. 6A and 6B show the digital switching of fluid flow rates of one embodiment.

FIG. 13 illustrates a face of a chuck with an inductive heater.

DETAILED DESCRIPTION

The heating and cooling apparatus described herein provides for rapidly varying the temperature of a DUT while the DUT is being functionally tested by Automatic Test Equipment (ATE). The ability to rapidly vary the temperature of the DUT while it is being tested reduces the amount of test time when compared to prior methods because the DUT need not be repeatedly removed, heated or cooled, and reinserted. The heating and cooling apparatus may be used in any test system, whether the DUT is a packaged IC device or a die of a semiconductor wafer. Furthermore, the heating and cooling apparatus may be used in more generic heat transfer applications to rapidly vary the temperature of any object in contact with the heating and cooling apparatus.

As will be described below with respect to the drawings, the plate spreads the heat to present a uniform temperature to the DUT. A heating and cooling apparatus that operates according to the present embodiments generally includes a plate that has low thermal capacity (i.e., the plate is incapable of storing much thermal energy) and high thermal conductivity (i.e., the plate is capable of transferring thermal energy rapidly) attached to a heat exchanger that is controlled to vary the temperature of the surface area of the plate that contacts the object. For purposes of nomenclature, the heating and cooling apparatus of the present invention is described as having a plate that presents a uniform temperature to the DUT. The plate is generally defined as any device or portion of a device that uniformly spreads heat. For example, the plate may be integrated into the heat exchanger, as a top portion of the heat exchanger, without deviating from the spirit and scope of the invention. Other fluid-based heat transfer devices may be used instead of a heat exchanger to provide similar functionality. By varying the flow rates of a cold fluid and a hot fluid, the temperature of the surface area of the plate may be set to any desired temperature within a predefined range of temperatures by way of conduction. The heat exchanger is preferably arranged to promote a relatively uniform temperature across the surface area of the plate that is to contact the object.

The advantage of being able to vary the temperature of the DUT during testing can also be provided by substituting the heat exchanger with another type of heat transfer device. For example, a resistive reactive heater may be coupled to the plate to vary the temperature of the surface area of the plate. Heat exchangers and other fluid-based heat transfer systems typically provide the ability to change temperatures more quickly than reactive heating devices. Another alternative embodiment couples an inductive heater to the plate or directly to the DUT. The use of an inductive heater is described more fully below in conjunction with a description of FIGS. 12 and 13.

Figure 1:
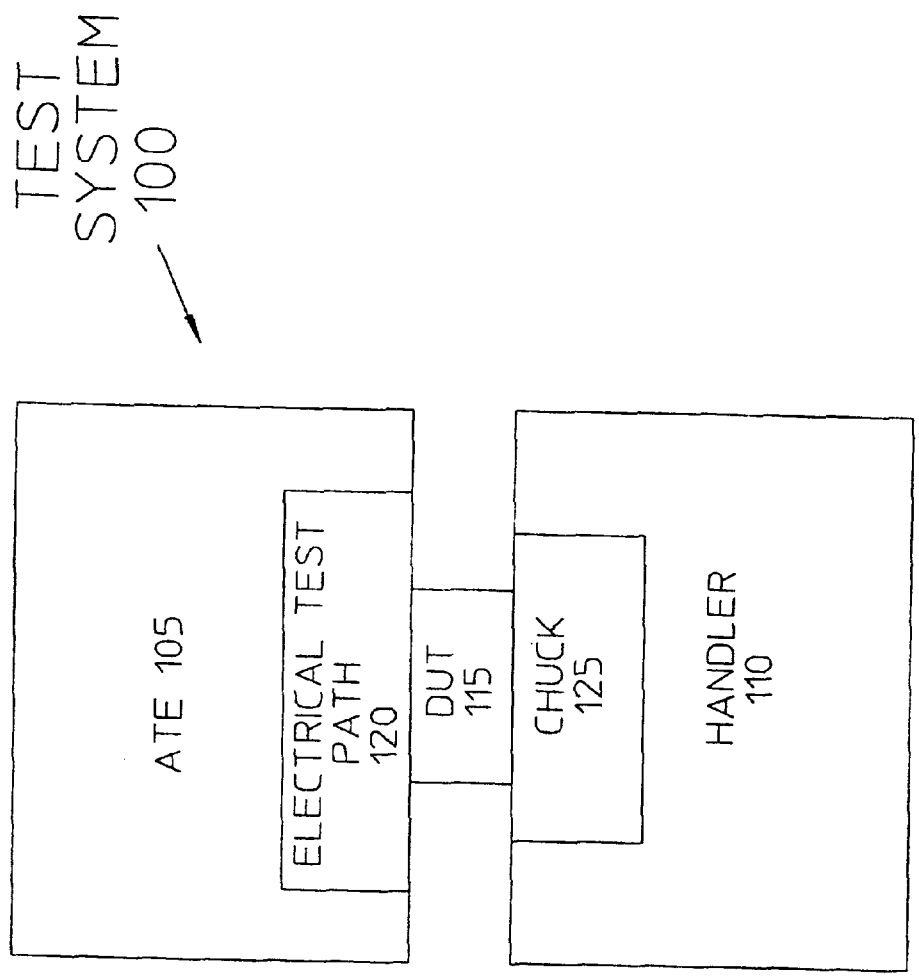
FIG. 1 is a block diagram of a test system that includes a heating and cooling apparatus of one embodiment.

FIG. 1 is a block diagram of a test environment that employs an apparatus of one embodiment. Specifically, FIG. 1 shows a test system 100 that includes Automatic Test Equipment (ATE) 105 and a handler 110 for testing DUT 115. Varying the temperature of the DUT 115 when the DUT 115 is in place for functional testing is accomplished by integrating a heating and cooling apparatus of the present embodiments into either the ATE 105 or the handler 110 (as shown in FIGS. 2A and 2B) such that the heating and cooling apparatus is in good thermal contact with the DUT 115 during functional testing.

The ATE 105 includes an electrical test path 120 for electrically testing the DUT 115. Depending on whether the test system 100 is for testing packaged devices or bare dice, the electrical test path 120 is either a test head for testing packaged semiconductor devices or a prober for testing the dice of a semiconductor wafer, respectively.

The handler 110 includes a chuck 125 that receives the DUT 115. Depending on whether the test system 100 is for testing packaged devices or bare dice, the chuck is either capable of receiving and holding a packaged semiconductor device or capable of receiving and holding a semiconductor wafer, respectively.

Figure 2C:
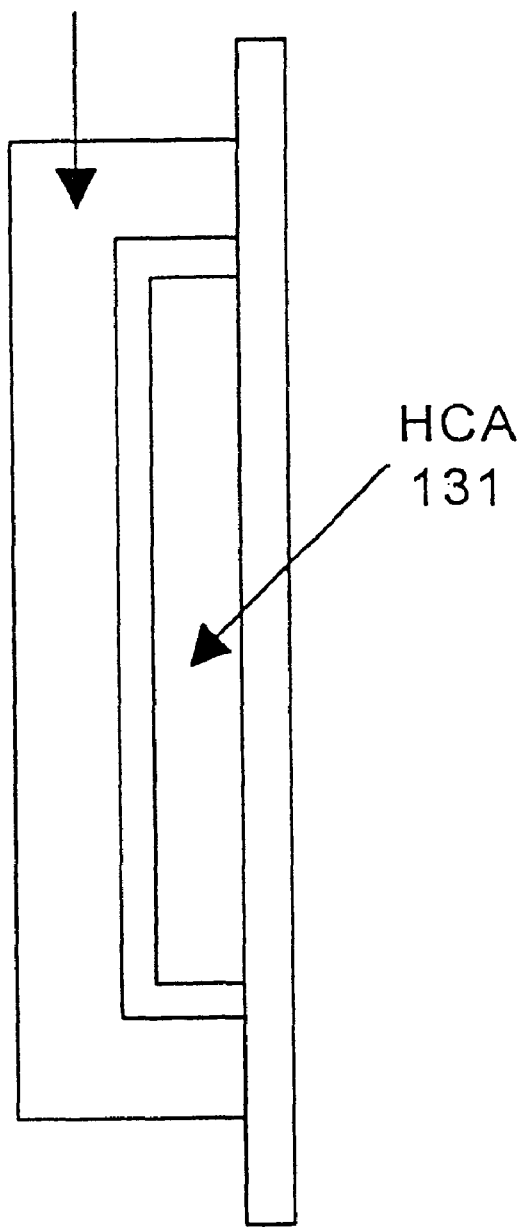
FIG. 2C illustrates a more detailed view of a heating and cooling apparatus and test socket shown in FIG. 2B for integration in a test head.

FIGS. 2A and 2B show exemplary test systems in more detail. According to the embodiment of FIGS. 2A and 2B, the handler 110 includes a "pick and place" insertion effector 126 that picks the DUT 115 from several packaged semiconductor devices 127 and that places and holds the DUT 115 in contact with the electrical test path of the ATE 105, which is a test socket 128 of a test head 129, so that functional testing of DUT 115 may be commenced. When testing of the DUT 115 has completed, the handler 110 removes the DUT 115 from the test socket 128, places the DUT 115 in the bin (not shown) indicated by the results of the test, and retrieves another packaged semiconductor device for testing. FIG. 2A shows the chuck 125 of the handler 110 as including a heating and cooling apparatus ("HCA") 130 that operates according to one embodiment, and FIG. 2B shows a heating and cooling apparatus ("HCA") 131 that is integrated for use with the test socket 128 of test head 129. FIG. 2C illustrates a more detailed view of the heating and cooling apparatus ("HCA") 131 and test socket 128 shown in FIG. 2B for integration in the test head 129.

Figure 3:
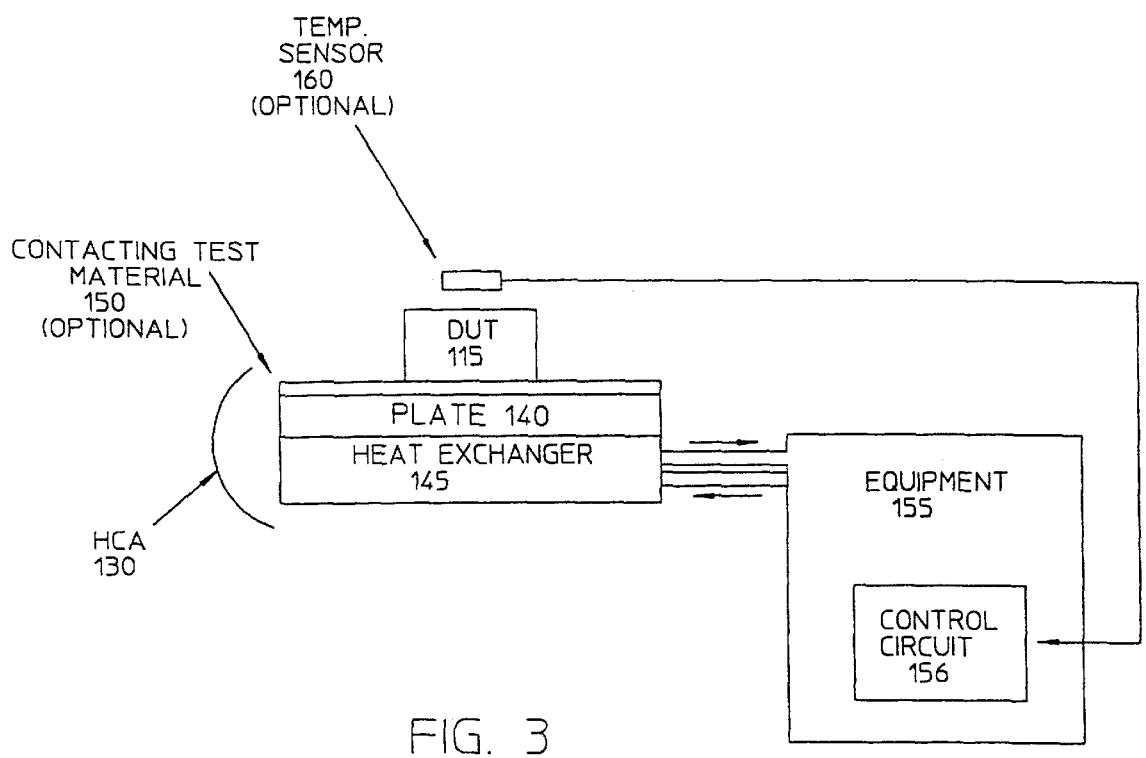
FIG. 3 is a block diagram of a heating and cooling apparatus of one embodiment

FIG. 3 is a block diagram of a heating and cooling apparatus of one embodiment. The heating and cooling apparatus 130 generally includes a plate 140 that is heated and cooled by a heat exchanger 145. During testing, the DUT 115 is coupled with good thermal contact to the plate 140 such that heat is transferred to and from the DUT 115 by the plate 140 through conduction. The temperature of the DUT 115 is controlled by controlling the flow rates of a plurality of heat transfer fluids through the heat exchanger, wherein each fluid has a different nominal temperature. The heat transfer fluids of the heat exchanger are heated or cooled to their nominal temperatures away from the heat exchanger 145 by equipment 155 that may operate according to known methods. Equipment 155 includes pumps (not shown) for circulating the fluids through the heat exchanger 145 and a control circuit 156 that controls the rates of flow for each fluid.

Figure 9:
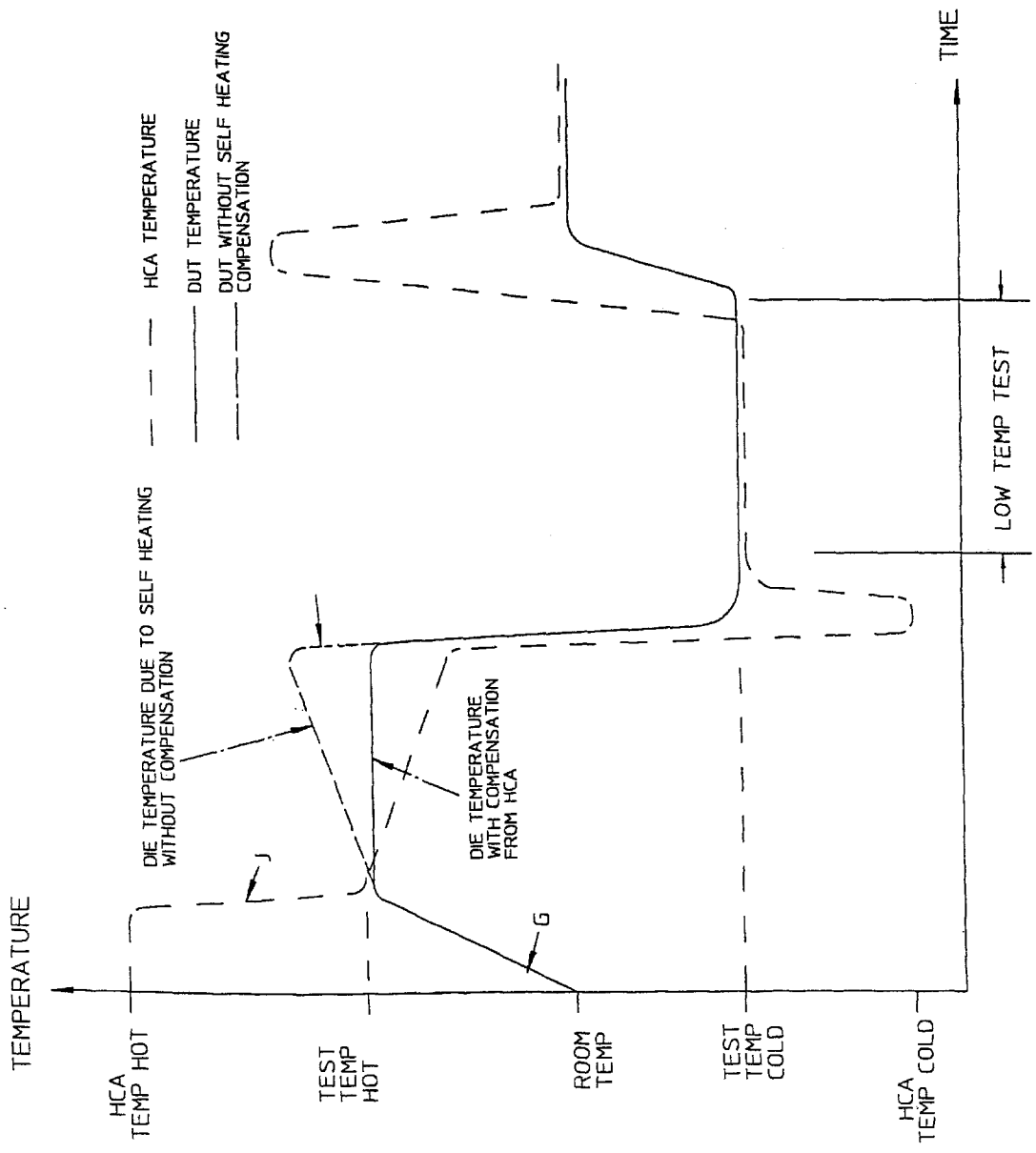
FIG. 9 shows self-heating compensation according to one embodiment.

A temperature sensor 160, such as a thermistor or infrared sensor (e.g., EG&G thermopile), can be optionally provided to sense the temperature of the DUT 115. The temperature sensor 160 is coupled in a feedback arrangement with the control circuit 156 such that the control circuit can ensure that the temperature of the DUT 115 is the desired temperature. A temperature sensor is particularly useful when the DUT 115 is a "self-heating" device, such as a highly integrated semiconductor device that dissipates large amounts of heat, which can be heated to exceedingly high temperatures if the heat generated by the DUT 115 is not accounted for. Properly controlling the temperature of a self-heating device typically requires characterizing the operating characteristics of an average self-heating chip. Controlling the temperature of devices that are not self-heating can typically be done in view of the nominal temperatures and flow rates of the fluids used by the heat exchanger 145 and without regard to the operating characteristics of the DUT. The effects of self-heating are illustrated in FIG. 9, which is discussed below.

One aspect of the present embodiments is that rapid changes in temperature can be achieved. In other words, the heating and cooling apparatus 130 has a high "thermal slew rate." High slew rates are enabled, in part, by minimizing the heat capacity of the plate 140 as much as practicable. The need to reduce the heat capacity of the plate 140 should be balanced against the need for high thermal conductivity so that heat may be more rapidly transferred between the plate 140 and the heat exchanger 145. This balancing allows the plate 140 to achieve rapid thermal equilibrium with the heat exchanger 145 when the temperature of the heat exchanger 145 is varied. According to one embodiment, the balance between low heat capacity and high thermal conductivity is struck by manufacturing the plate 140 from a thin sheet (e.g., 0.060 inches thick) of highly thermally conductive material such as copper. To ensure good thermal contact between the DUT 115 and the plate 140, a contacting material 150 may be attached to the plate to contact the DUT. For example, a compliant sheet of metal impregnated plastic can be attached to the DUT side of the plate 140. The contacting material need not be as thermally conductive as the material of the plate.

High thermal slew rates are also enabled by the manner in which the heat exchanger 145 is operated. According to the present embodiments, the heat exchanger 145 is recuperative and includes at least two sets of channels, each for circulating one of a corresponding number of heat transfer fluids. Such an arrangement is discussed with respect to FIGS. 4A–4C, below. For the purposes of the present discussion and the appended claims, the term "set" will be understood to mean "one or more" or "at least one," and the term "fluid" will be understood to encompass both liquids and gases. The heat exchanger 145 may alternatively be a regenerative heat exchanger wherein multiple heat transfer fluids are isolated from one another but are alternately circulated through the same channels.

Each heat transfer fluid circulated by the heat exchanger 145 has a different nominal temperature. According to one embodiment, when only two heat transfer fluids are used, there is a "hot fluid" that defines the maximum possible temperature that may be achieved by the heating and cooling apparatus 130, and there is a "cold fluid" that defines the minimum possible temperature that may be achieved by the heating and cooling apparatus 130. The temperature of the surface area of the plate 140 and therefore the temperature of the DUT 115 may be any temperature within the range defined by the hot and cold fluids. For example, the cold fluid may have a temperature of negative 100 degrees Celsius, the hot fluid may have a temperature of positive 250 degrees Celsius, and the temperature of the DUT 115 may be set to any temperature between the two extremes by appropriately varying the flow rates of the hot and cold fluids.

The flow rate of a each fluid can be independently adjusted in a proportional fashion such that the flow rate of that fluid can be any value within a range of values. Alternatively, the flow rate of each fluid can be varied "digitally" by switching between a corresponding minimum flow rate and a corresponding maximum flow rate for that fluid. Digital switching of flow rates is described in more detail with respect to FIGS. 7A and 7B, below. Regardless of the manner in which the flow rates of the fluids are adjusted, the temperature of the surface area of the plate 140 is proportional to the respective flow rates and temperatures of each fluid.

Figure 4A:
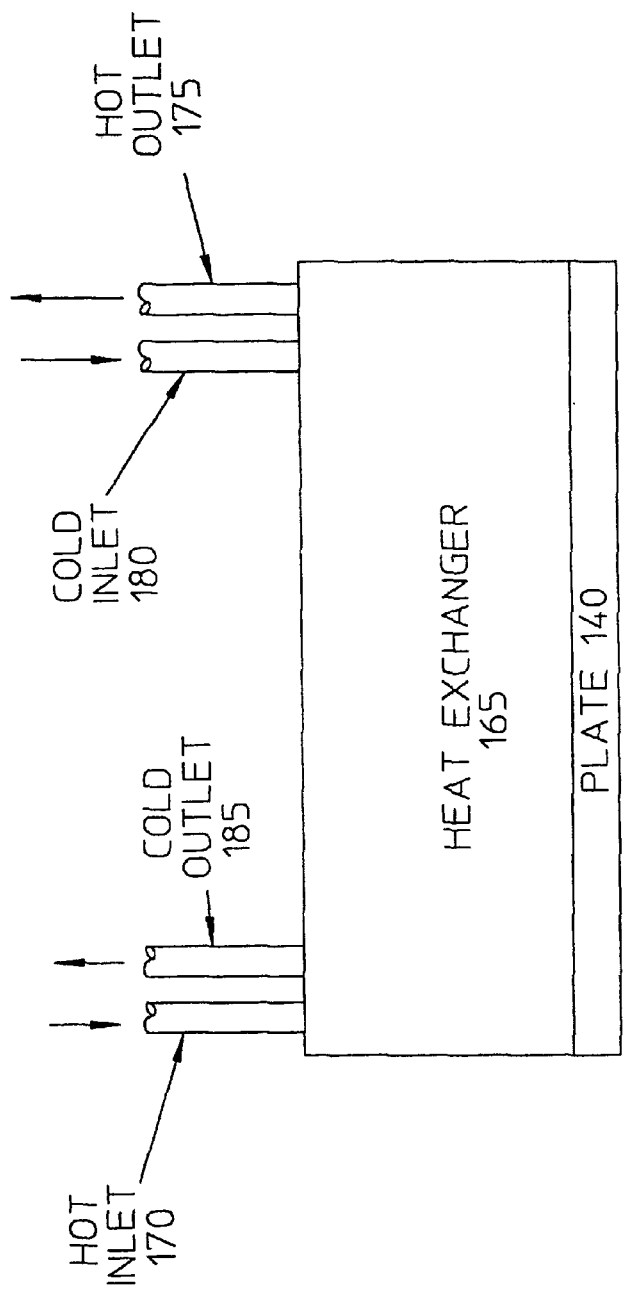
FIGS. 4A–4C show a heating and cooling apparatus of one embodiment.
Figure 4B:
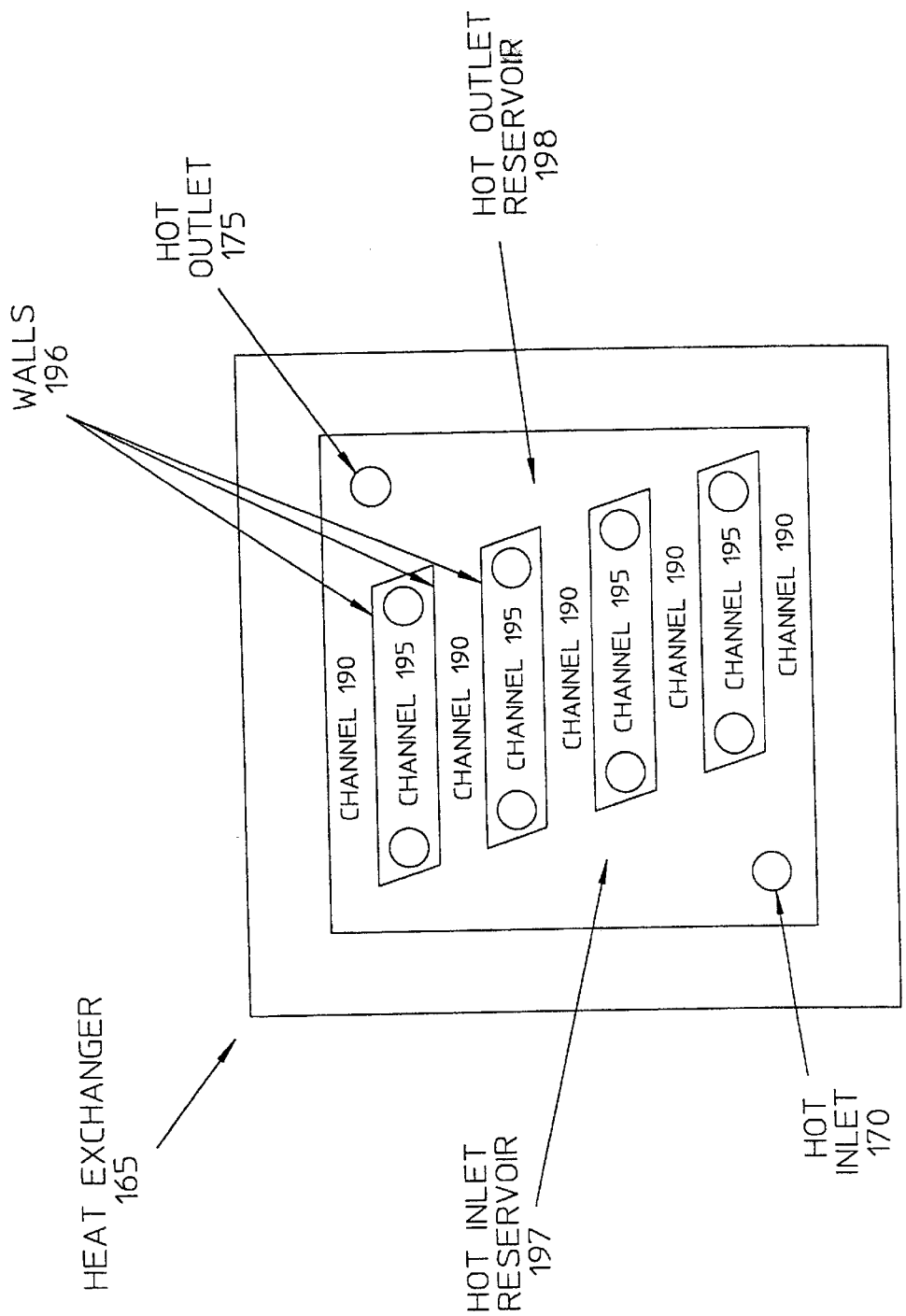
Figure 4C:
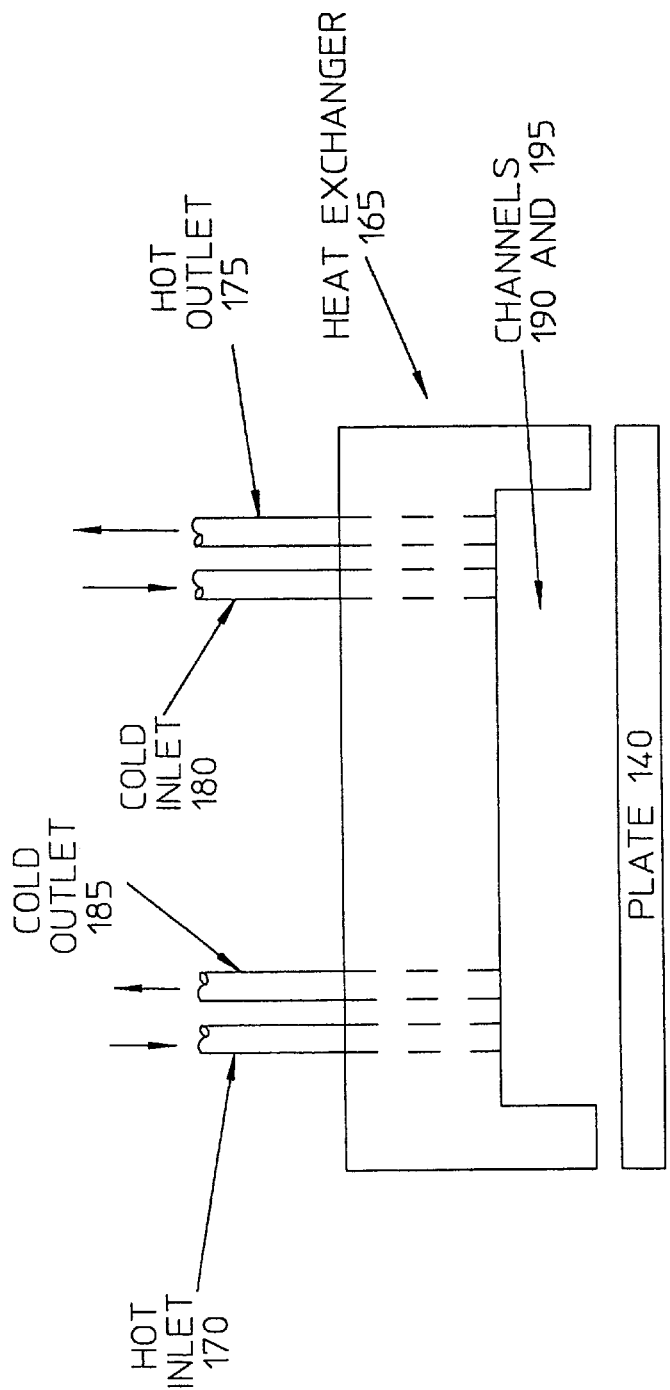

FIGS. 4A–4C show one possible heat exchanger that can be used in a heating and cooling apparatus of the present embodiments. The heat exchanger 165 of FIGS. 4A–4C circulates only two fluids, a hot fluid and a cold fluid, and the heat exchanger 165 is therefore shown as including a hot inlet 170, a hot outlet 175, a cold inlet 180, and a cold outlet 185. The direction of flow is indicated by the arrows. Additional inlets and outlets may be provided should additional fluids be desired. A hole may be formed through the middle of the body of heat exchanger 165 to provide a line of sight between a pyrometric temperature sensor (such as that shown in FIG. 3) and the DUT.

The heat exchanger 165 may also include a closed loop (not shown), which circulates an additional heat transfer fluid but does not require additional inlets or outlets, positioned between the plate 140 and the other channels of the heat exchanger (shown in FIG. 6) so as to exchange heat with the fluids of the other channels. Such a closed loop can be used to provide a relatively uniform temperature across the surface of the plate without requiring the complex geometries of the channels as shown in FIG. 5.

FIG. 4B shows a top view of the heat exchanger 165, which includes a set of first channels 190 and a set of second channels 195 that are interdigitated such that each neighboring channel of a first channel is from the set of second channels, and vice versa. The set of first channels 190 convey the hot fluid, and the set of second channels convey the cold fluid. The walls 196 between the first and second channels are relatively thin, to maximize thermal conductivity, and are manufactured of a highly thermally conductive material to promote the rapid exchange of heat between the hot and cold fluids. FIG. 4B also shows a hot inlet reservoir 197 and a hot outlet reservoir 198. A cold inlet reservoir (not shown) and a cold outlet reservoir (also not shown) are provided, but are located beneath the hot inlet and outlet reservoirs.

According to an alternative embodiment, the set of first channels and the set of second channels each include a single serpentine channel that switches back and forth. The serpentine channels are arranged relative to one another to provide interdigitation similar to that of the multiple channel embodiment depicted in FIG. 4B. Regardless of the manner that interdigitation is achieved, the interdigitation of the sets of first and second channels reduces thermal gradients and promotes uniform temperatures across the surface of the plate 140 that overlays the interdigitated channels.

FIG. 4C shows a side view of the heat exchanger 165 wherein the plate 140 is provided as a lid for covering the interdigitated channels of the heat exchanger 165. Using the plate 140 to cover the channels allows the plate to directly contact hot and cold fluids, which promotes heat transfer between the hot and cold fluids, as well as between the DUT and the heating and cooling apparatus. The plate 140 spreads the heat generated in the heat exchanger 165 to present a uniform temperature to the DUT. As described above, a closed loop containing another heat transfer fluid may be disposed between the sets of first and second channels such that the plate 140 acts as a lid to the closed loop to contact the fluid of the closed loop. Furthermore, additional fluids and sets of channels may be provided.

According to alternative embodiments, fluids of different temperatures can be mixed, depending on the temperatures used in temperature binning. Another alternative is to provide a set of channels for each temperature to be tested and a fluid for each channel that has a temperature equal to one of the temperatures to be tested. When a particular test temperature is desired, the corresponding fluid is set to a maximum flow rate, and the remaining fluids are placed in a no flow condition. Yet another alternative is to provide a single set of channels or a chamber through which one of a plurality of fluids is circulated, depending on the test temperature desired.

Figure 5A:
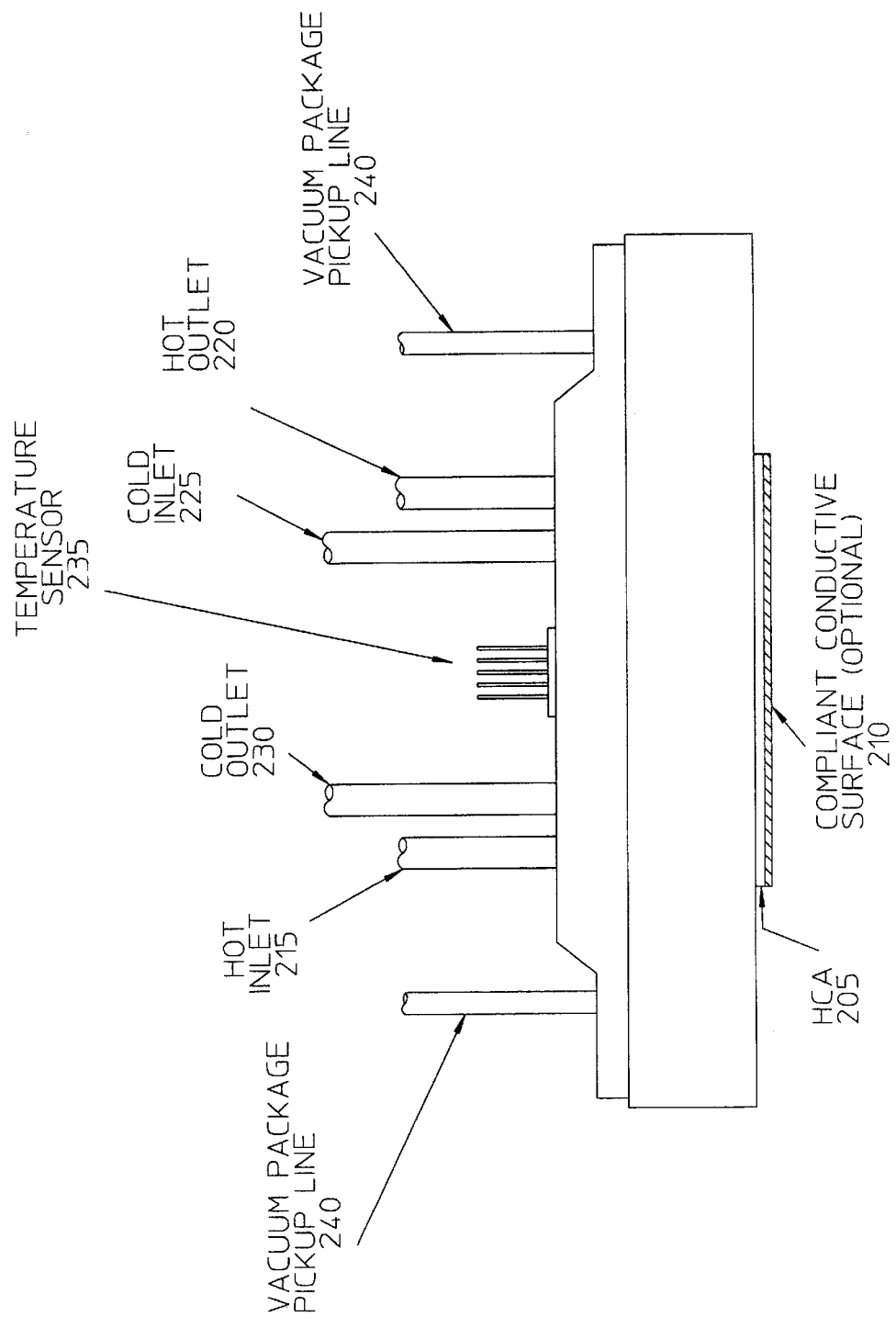
FIGS. 5A–5F show a heating and cooling apparatus of one embodiment integrated into the chuck of a handler.

Now that the basic of operation of a heating and cooling apparatus of the present embodiments has been described, a more detailed embodiment will be described with respect to FIGS. 5A–F. FIG. 5A is a side view of a chuck 200 having integrated therein a heating and cooling apparatus ("HCA") 205 that operates according to the present embodiments. The HCA 205 is shown as having an optional compliant conductive surface 210 attached thereto for improving thermal contact with a DUT. The chuck 200 is shown as including a hot inlet 215, a hot outlet 220, a cold inlet 225, a cold outlet 230, a temperature sensor 235, and a plurality of vacuum package pick up lines 240.

Figure 5B:
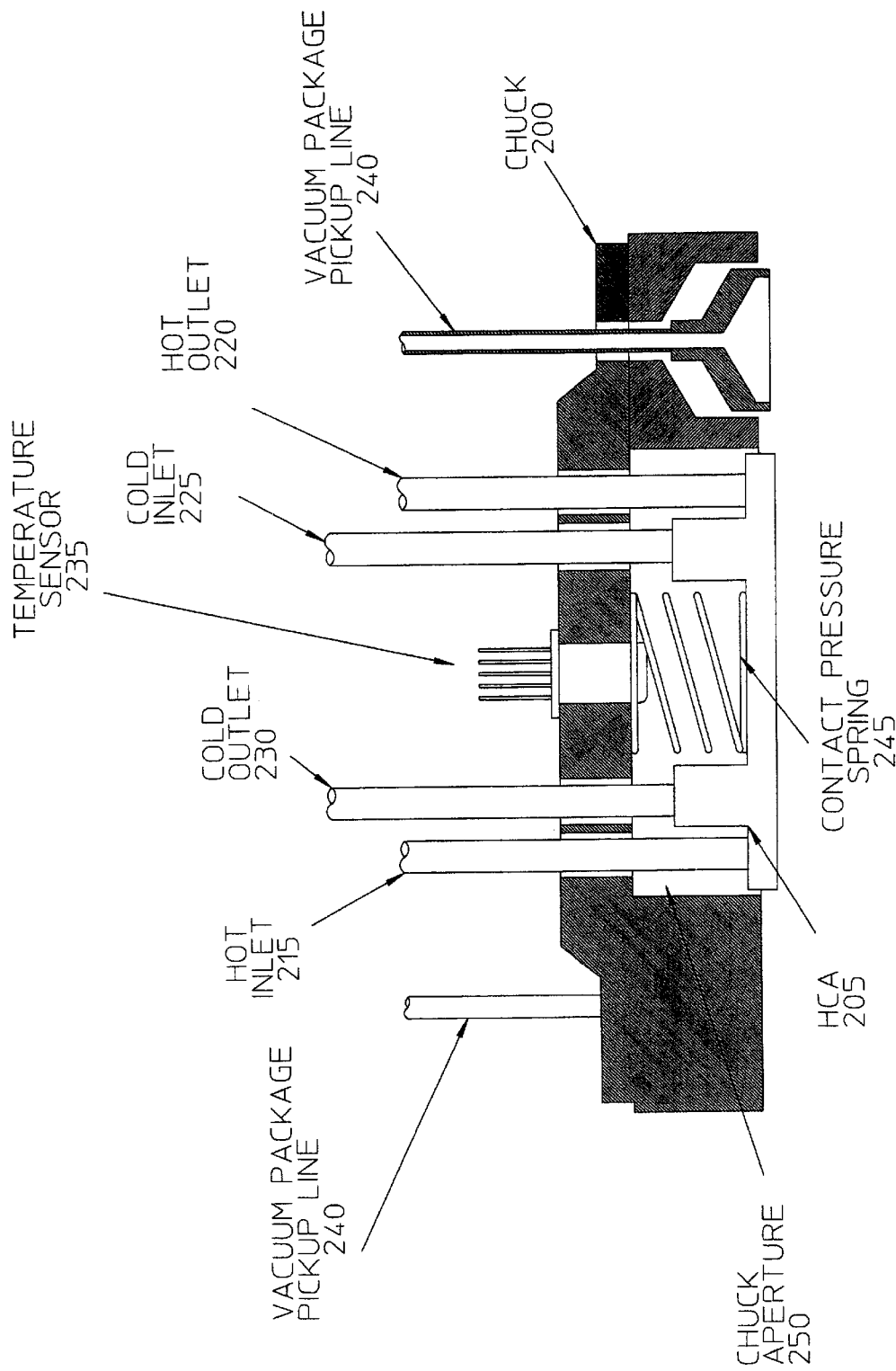

FIG. 5B is a cut away side view of the chuck 200, which shows a contact pressure spring 245 that supports the HCA 205 and allows the HCA to be recessed within the chuck 200. When a DUT is picked up and placed in the test socket of a test head, the chuck 200 presses the DUT in place, compressing the spring 245 such that the HCA 205 recesses within the chuck aperture 250. The pressure provided by the spring 245 ensures good thermal contact between the HCA 205 and the DUT.

Figure 5C:
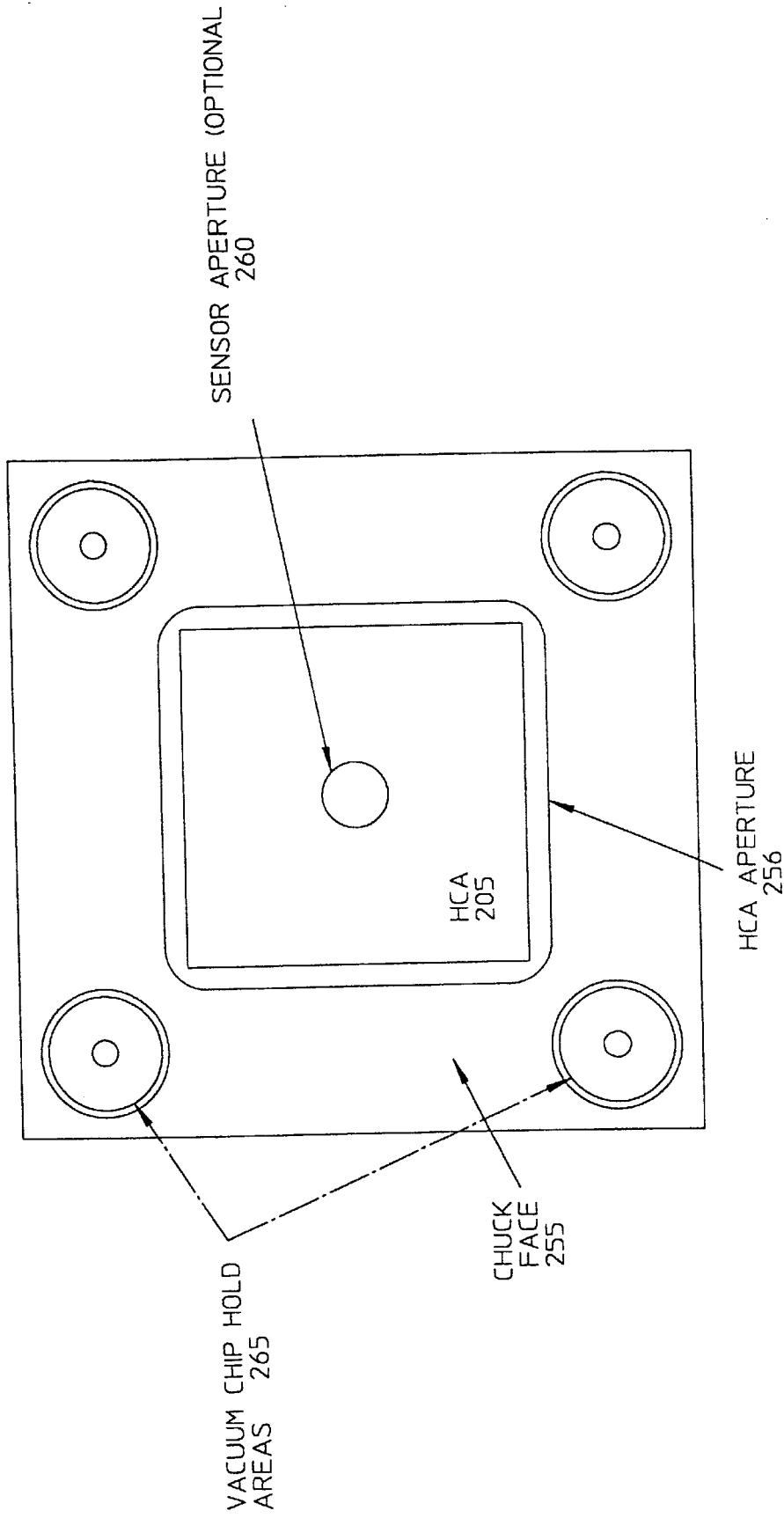

FIG. 5C shows a view of the face 255 of the chuck 200 for contacting a DUT. As shown, an HCA aperture 256 is formed in the face of the chuck 200 to allow the HCA 250 to recess into the chuck 200 when the HCA 205 is pressed against a DUT for testing. The HCA aperture 256 and the chuck aperture 250 result in the HCA 205 being thermally isolated from the rest of the chuck 200 by air such that HCA 205 need not heat and cool the entire mass of the chuck 200. An optional temperature sensor aperture 260 is shown as being formed in the middle of HCA 205 to allow a line of sight to the DUT so that non-contacting temperature sensor 235 can detect the temperature of the DUT. Several vacuum chip hold areas 265 are provided to allow the chuck 200 to pick up a DUT by suction. The vacuum chip hold areas 265 are connected to the vacuum package pick up lines 240, as shown in FIG. 5B.

Figure 5D:
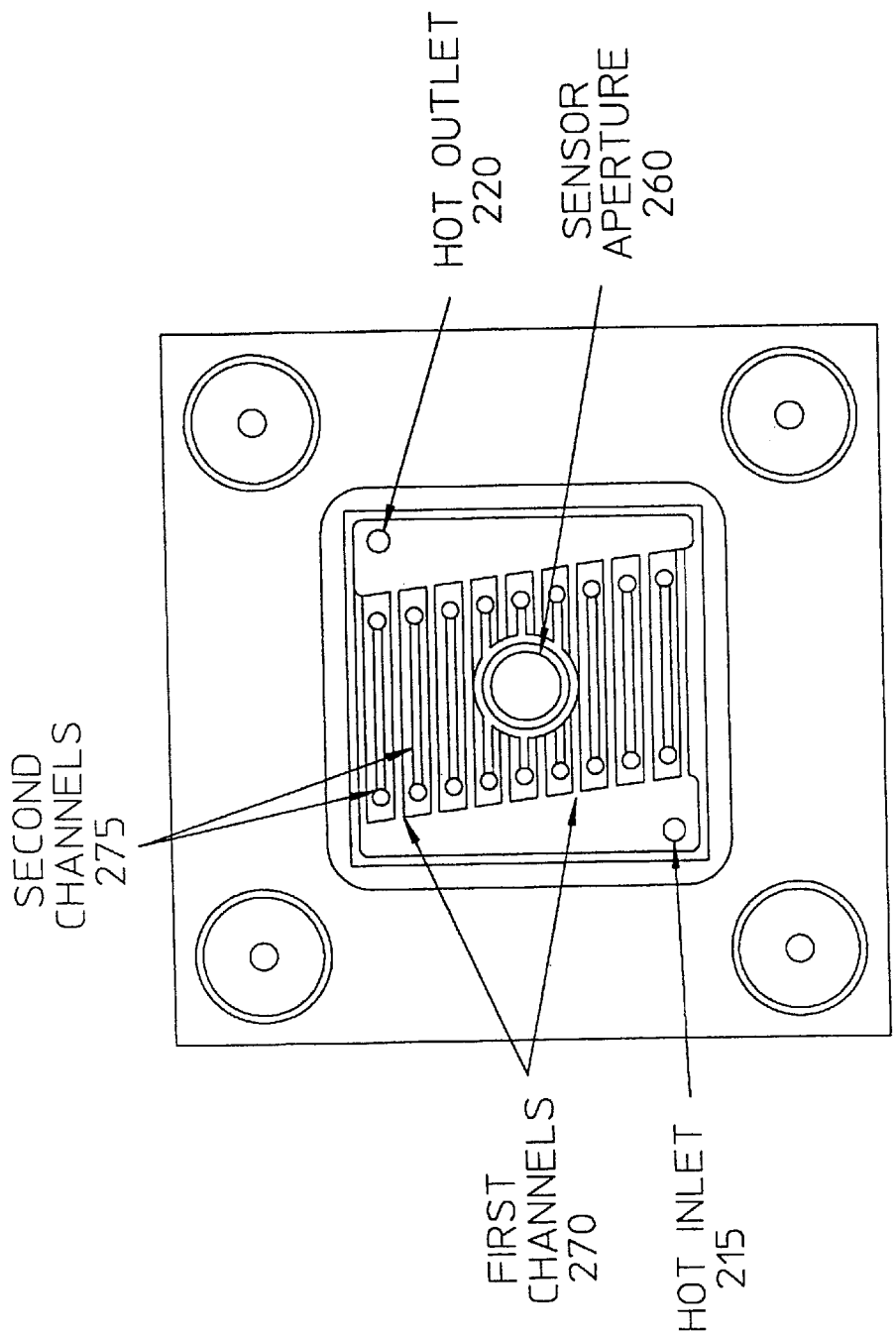
Figure 5E:
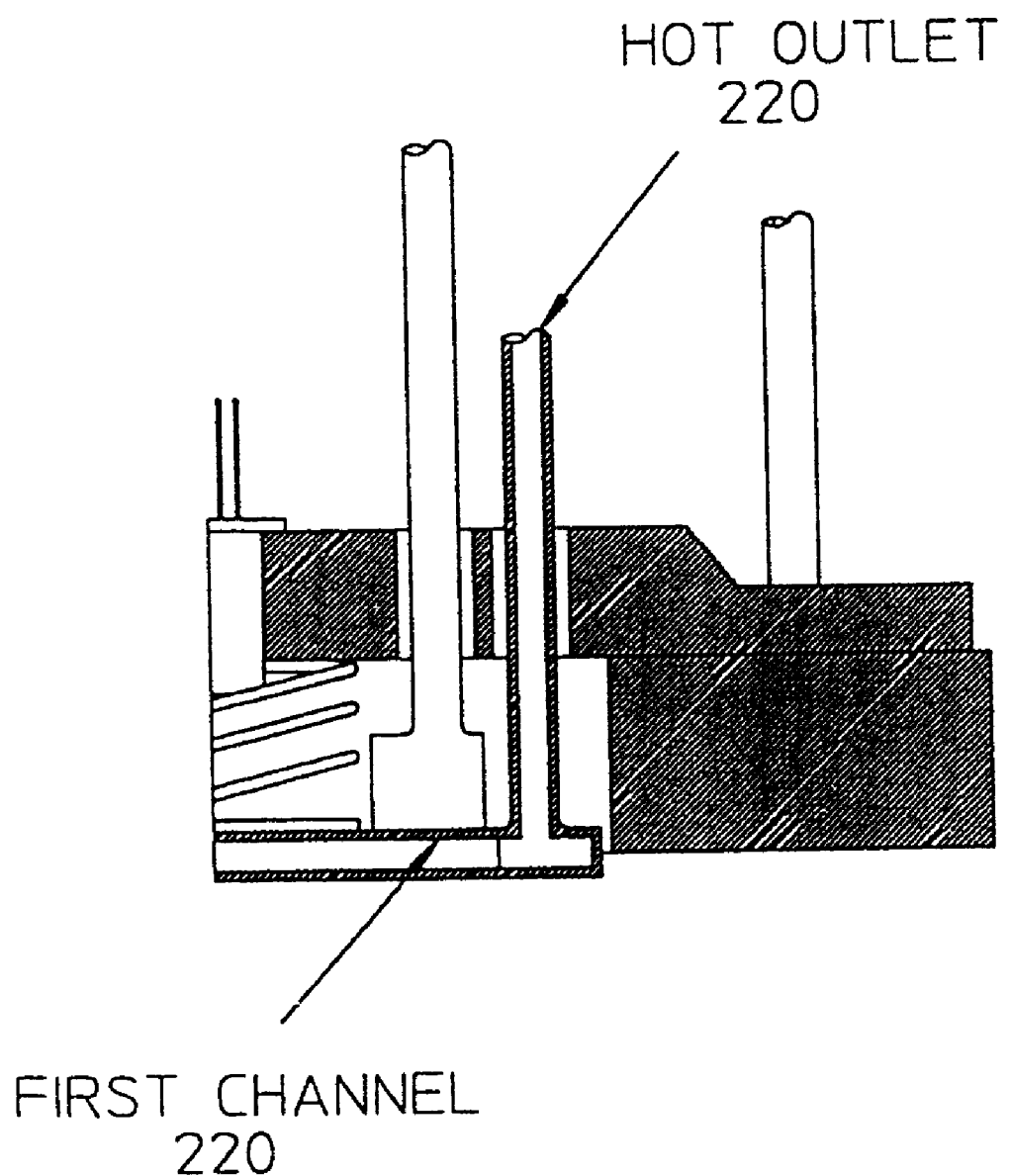
Figure 5F:
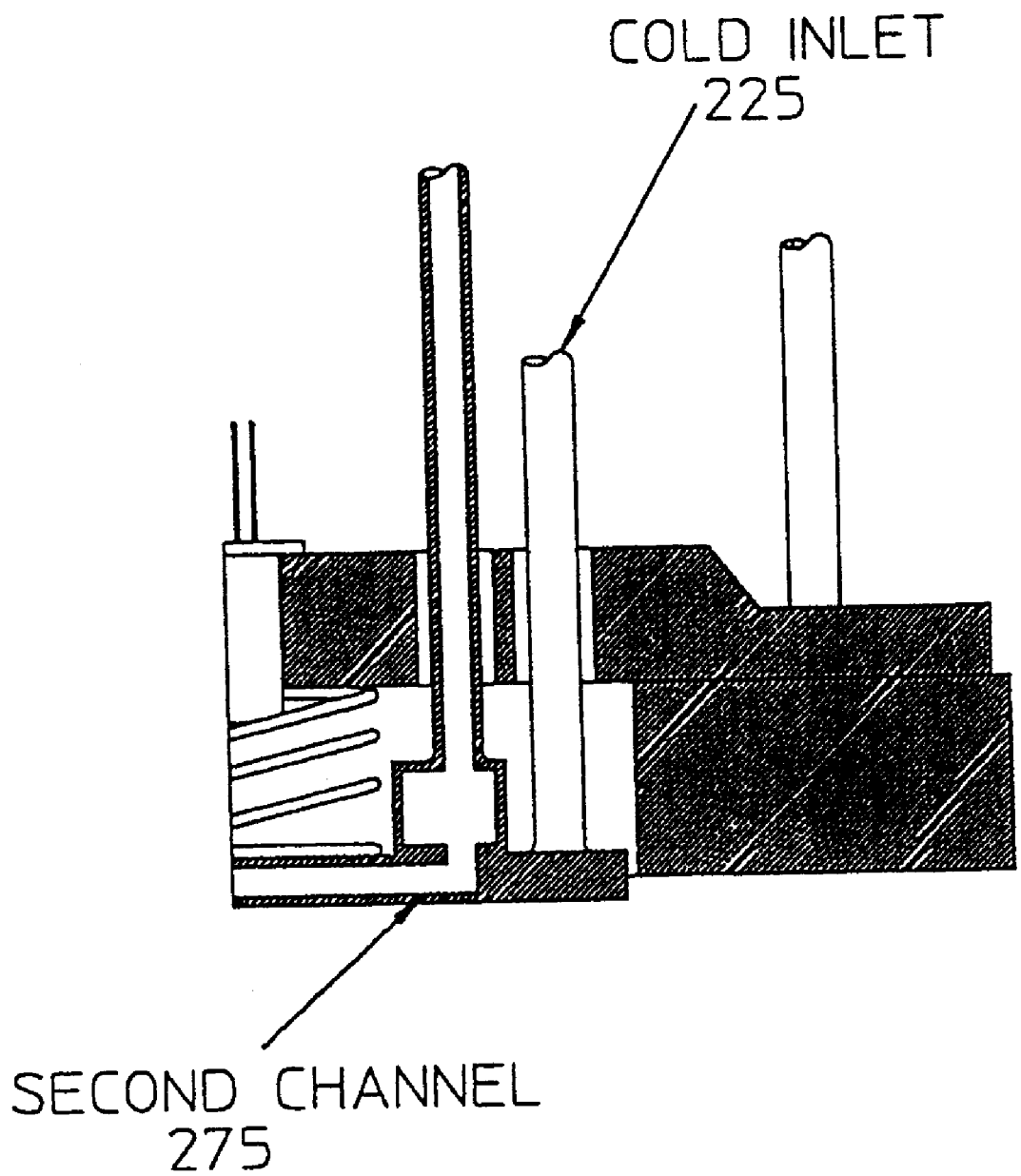

FIG. 5D shows a cut away view of the face of the HCA 205 to expose the arrangement of the set of first channels 270 and the set of second channels 275. FIGS. 5E and 5F show cut away side views that further illustrate the relative arrangement of the sets of first and second channels.

FIGS. 6A and 6B show the "digital" switching of the hot and cold fluids according to one embodiment. The flow rates of the fluids are controlled independently and may be controlled by frequency modulation or by varying the duty cycle of a periodic control signal having a set frequency. Because the nominal temperatures of the hot and cold fluids can be quite different, the hot and cold fluids are typically different and have different thermal properties. Therefore, the relative minimum and maximum flow rates of the hot and cold fluids may also be different.

FIG. 6A shows that the relative minimum and maximum flow rates of the hot and cold fluids can be different. Waveform A shows the hot fluid flow rate, and waveform B shows the cold fluid flow rate. The minimum flow rates of fluids can be zero, but fluid hammer can result, and zero flow rates are typically undesirable. The maximum and minimum flow rates of the fluids may also be affected by the geometries of the first and second channels. FIG. 6B shows that the duty cycle or the frequency of the switching can be adjusted to vary the flow rate.

Figure 7:
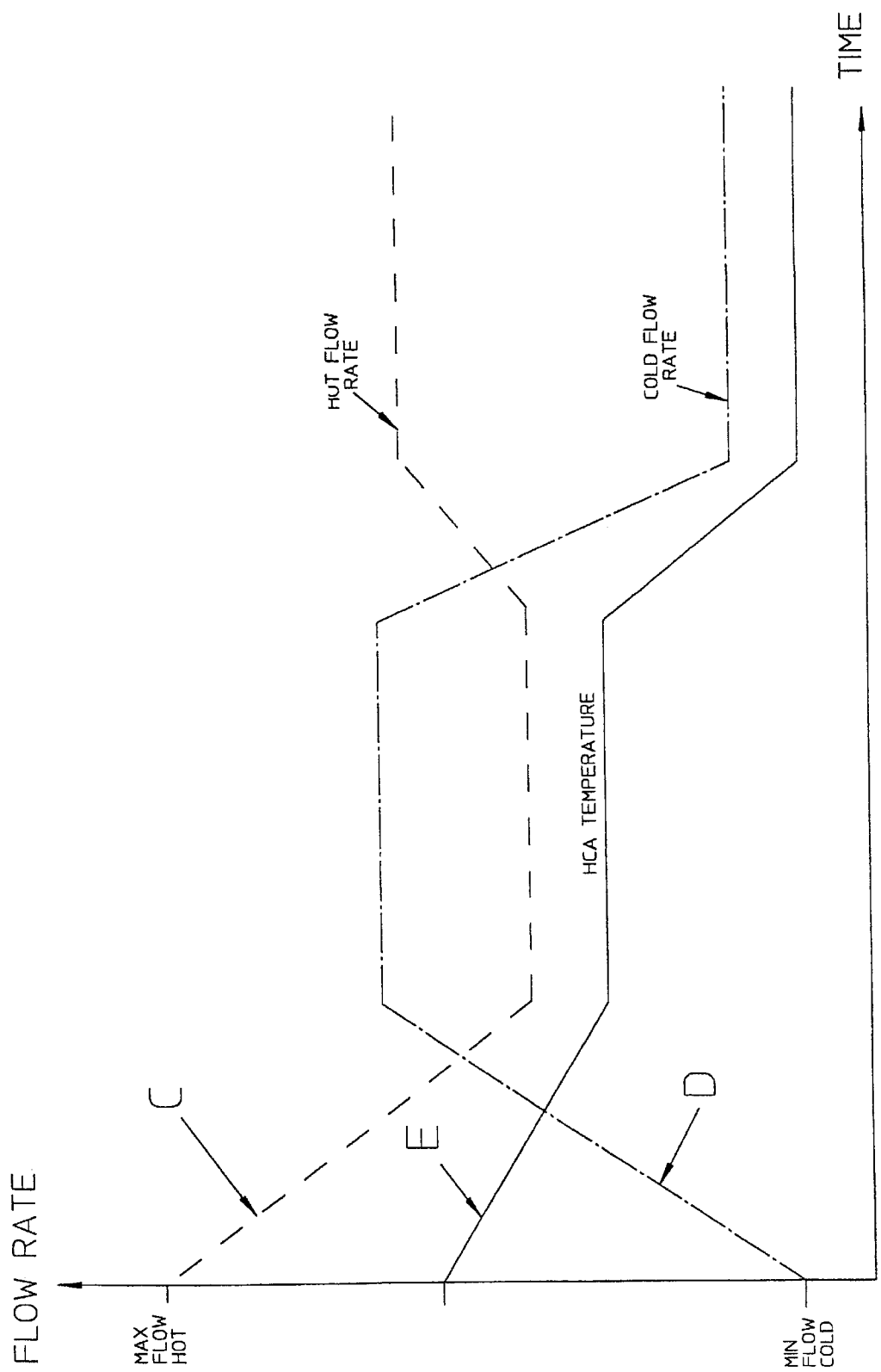
FIG. 7 shows the proportional control of fluid flow rates according to one embodiment.

FIG. 7 shows that the temperature of the heating and cooling apparatus ("HCA temperature") can alternatively be controlled by merely scaling the hot and cold flow rates. Waveform C shows the hot fluid flow rate, waveform D shows the cold fluid flow rate, and waveform E shows the temperature of the heating and cooling apparatus.

Figure 8:
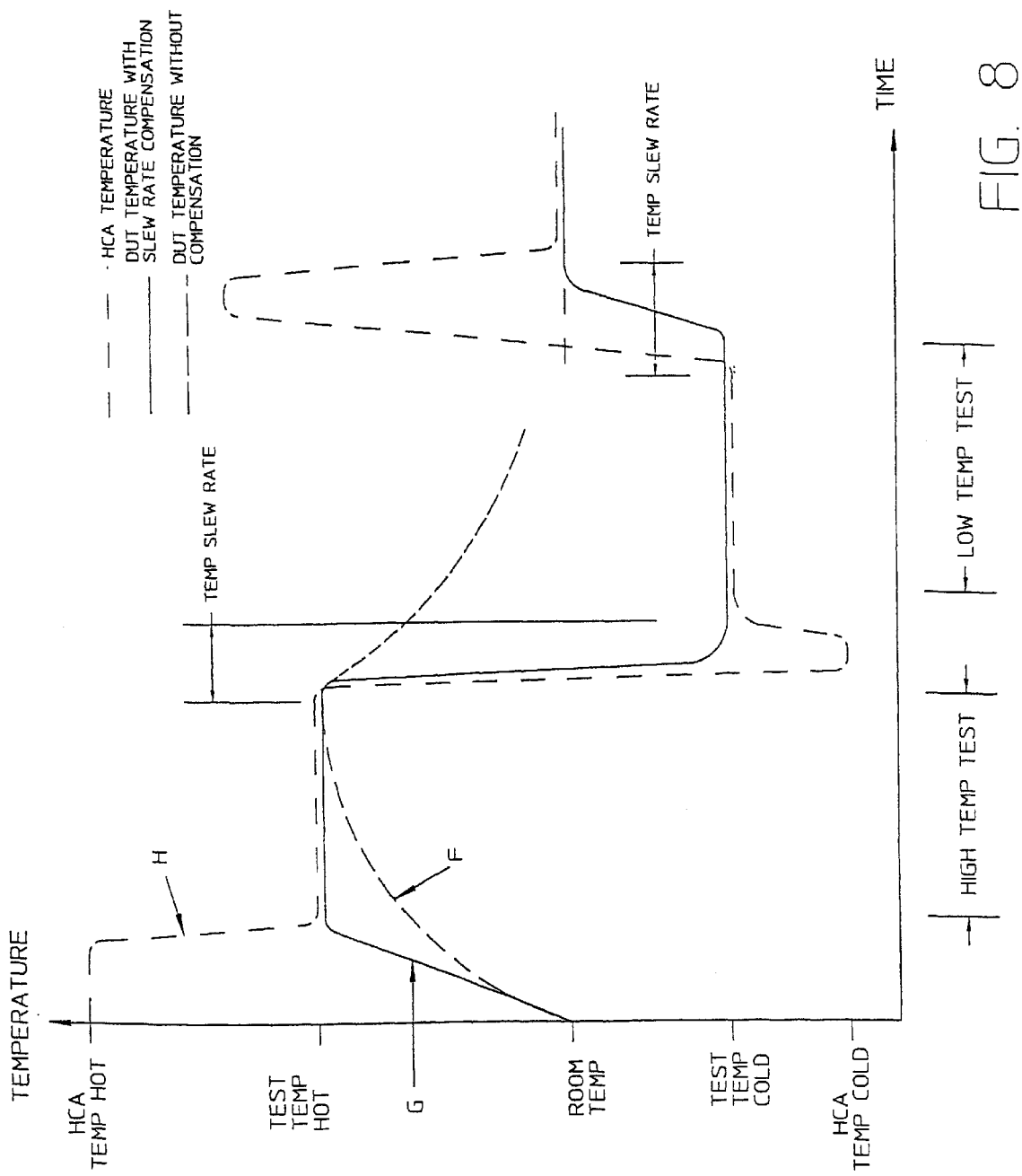
FIG. 8 shows slew rate compensation according to one embodiment.

FIGS. 8 is a diagram that illustrates a manner in which the flow rates of the fluids of the heat exchanger can be controlled to further increase the thermal slew rate of a heating and cooling apparatus that operates according to the present embodiments. The thermal characteristics, such as thermal capacity and thermal conductivity, of an object prevent the instantaneous transfer of heat between the object and a heat source or cold source. Therefore, when a heat source is applied to an object, the temperature of the object will rise over time as an exponential function of the temperature of the heat source, temperature of DUT, the thermal capacity of the object, and the thermal conductivity of the object until the temperature of the object is equal to the temperature of the heat source. The rise in temperature is initially rapid but slows as the temperature of the DUT 115 approaches the temperature of the heat source.

Similarly, when a cold source is applied to an object, the temperature of the object will fall over time as an exponential function of the temperature of the cold source, temperature of DUT, the thermal capacity of the object, and the thermal conductivity of the object until the temperature of the object is equal to the temperature of the cold source. The fall in temperature is initially rapid but slows as the temperature of the DUT 115 approaches the temperature of the cold source. An analog in the electrical arts may be found in the charging and discharging of a capacitor. It would be desirable to maintain the linear rise and fall of the temperature for as long as possible to reduce the amount of time to heat and cool the DUT 115 and increase the thermal slew rate.

Improved thermal slew rates may be achieved by providing a heating and cooling apparatus that uses fluids having nominal temperatures above the hot set point temperature and below the cold set point temperature of the DUT. For hot tests, the temperature of the heating and cooling apparatus is held for a time at a high temperature above the hot set point temperature and then rapidly slewed to the hot set point temperature. Similarly, for cold tests, the temperature of the heating and cooling apparatus is held for a time at a cold temperature below the cold set point temperature and then rapidly slewed to the cold set point temperature. Slewing of the temperature of the heating and cooling apparatus from the delta value temperature and the set point temperature occurs when the temperature of the DUT is approximately the set point temperature, which may be determined by using a temperature sensor or by knowledge of the thermal characteristics of the DUT and the time the delta value temperature has been applied to the DUT. To better ensure that there is no overshoot of the set point temperature, the DUT temperature at which the heating and cooling apparatus begins to slew is selected in view of the thermal slew rate of the heating and cooling apparatus and the thermal characteristics of the DUT.

Waveform F of FIG. 8 shows the temperature of a DUT without slew rate compensation wherein the temperature of the heating and cooling apparatus is merely set to the hot test temperature and the cold test temperature. Waveform G of FIG. 8 shows that setting the temperature of the heating and cooling apparatus in the manner shown by waveform H of FIG. 8 results in the temperature of the DUT reaching the desired test temperature more rapidly, which shortens test time.

FIG. 9 shows the results of self-heating compensation, which was described above. FIG. 9 is similar to FIG. 8, but further shows a waveform I that shows the temperature of a self-heating DUT without compensation and a waveform J that shows the effect of self-heating compensation on the temperature of the heating and cooling apparatus. Again, self-heating compensation is achieved by use of a sensor that senses the temperature of the DUT.

Figure 10:
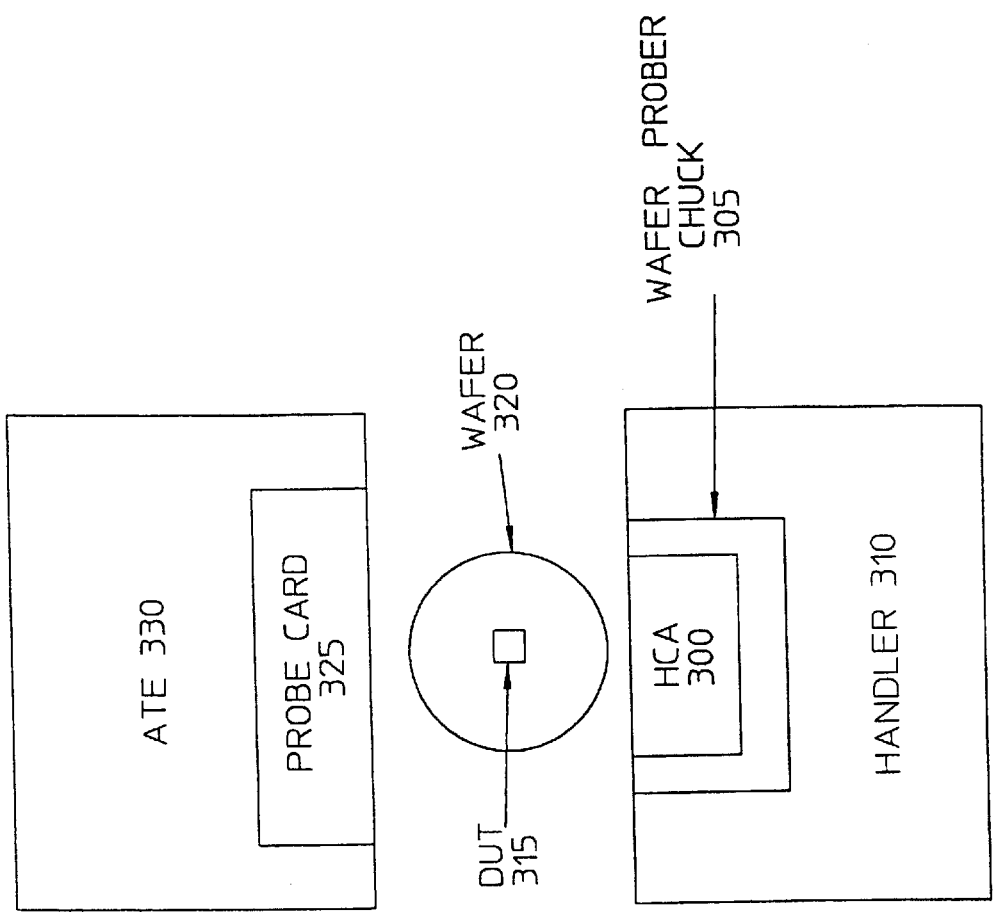
FIG. 10 is a block diagram of a test system according to one alternative embodiment.

FIG. 10 is a block diagram showing a heating and cooling apparatus 300 being integrated into a wafer prober chuck 305 of a handler 310, wherein the DUT 315 is a semiconductor die of a wafer 320. The DUT 315 is tested by a prober 325 of ATE 330.

Figure 11:
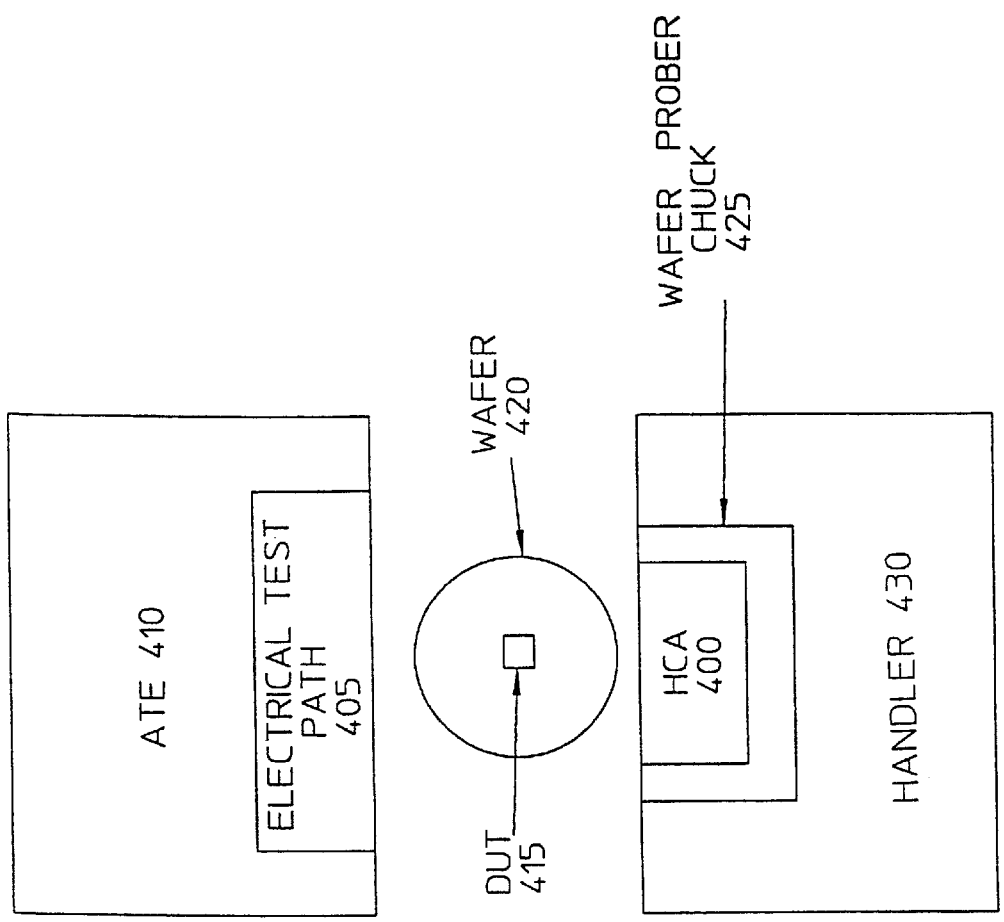
FIG. 11 is a block diagram of a test system according to another alternative embodiment.

FIG. 11 is a block diagram showing a heating and cooling apparatus 400 being integrated into a prober 405 of ATE 410, wherein the DUT 415 is a semiconductor die of a wafer 420. The wafer 420 is held in place by a wafer prober chuck 425 of handler 430.

Figure 12:
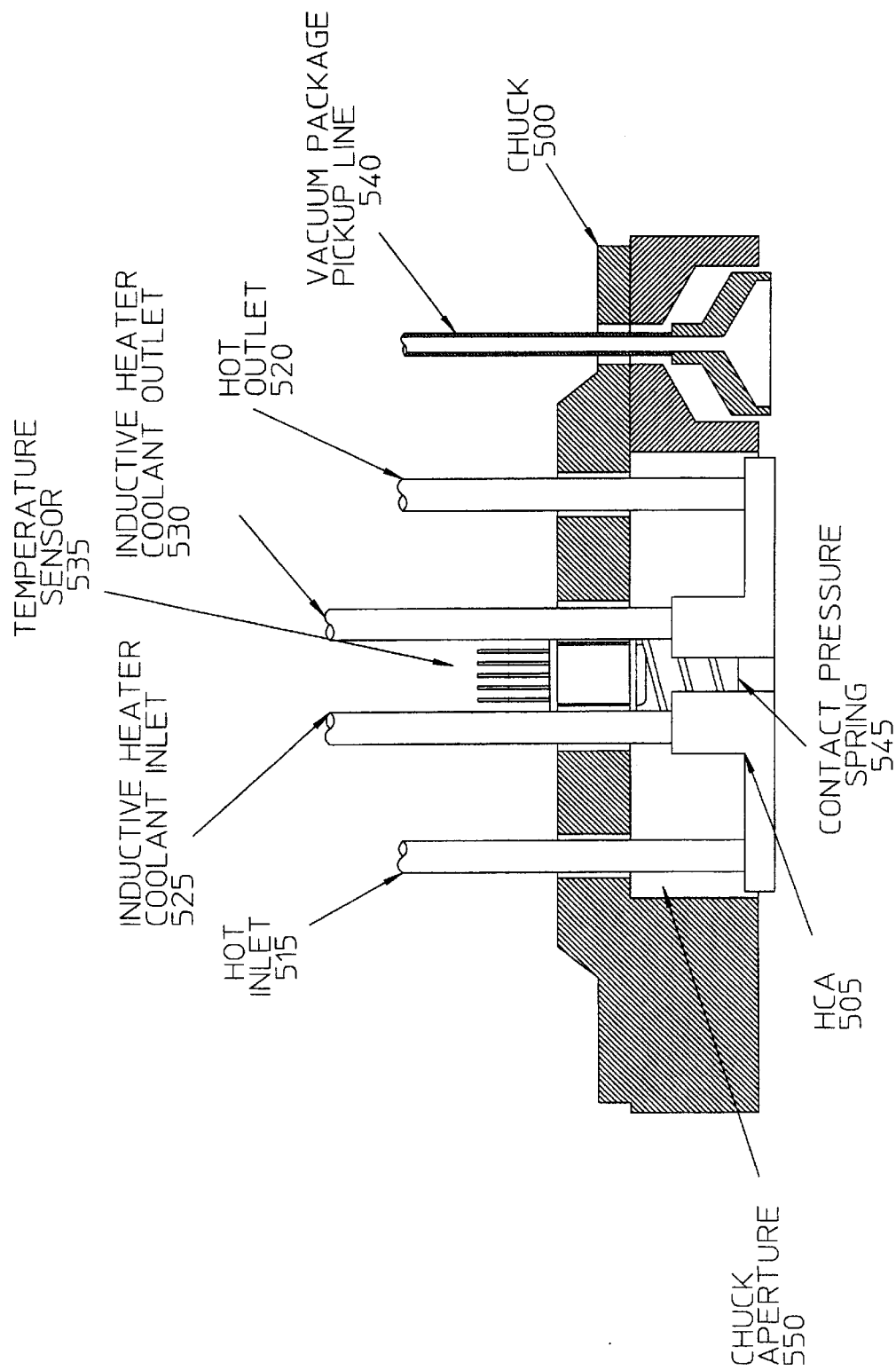
FIG. 12 is a cut away side view of a chuck that integrates an inductive heater.

FIG. 12 is a cut away side view of a chuck 500 having integrated therein a heating and cooling apparatus ("HCA") 505 that operates according to an additional embodiment. The heating and cooling apparatus ("HCA") 505 includes an inductive heater. The chuck 500 is shown as including a hot inlet 515, a hot outlet 520, an inductive heater coolant inlet 525, an inductive heater coolant outlet 530, a temperature sensor 535, and a vacuum package pick up line 540. FIG. 12 also shows a contact pressure spring 545 that supports the HCA 505 and allows the HCA 505 to be recessed within the chuck 500. As described above in conjunction with FIG. 5B, when a DUT is picked up and placed in the test socket of a test head, the chuck 500 presses the DUT in place, compressing the spring 545 such that the HCA 505 recesses within the chuck aperture 550. The pressure provided by the spring 545 ensures good thermal contact between the HCA 205 and the DUT.

FIG. 13 shows a view of a face of the chuck 500 with an inductive heater. As shown in FIG. 13, a HCA aperture 555 is formed in the chuck face 560 to allow the HCA 505 to recess into the chuck 500 when the HCA 505 is pressed against a DUT for testing. As discussed above in conjunction with the embodiment shown in FIG. 5C, the HCA aperture 555 and the chuck aperture 550 result in the HCA 505 being thermally isolated from the rest of the chuck 500 by air such that HCA 505 need not heat and cool the entire mass of the chuck 500. An optional temperature sensor aperture 565 is shown as being formed in the middle of HCA 505 to allow a line of sight to the DUT so that non-contacting temperature sensor 535 can detect the temperature of the DUT. Several vacuum chip hold areas 570 are provided to allow the chuck 500 to pick up a vacuum suction. The vacuum chip hold areas 570 are connected to the vacuum package pick up lines 540, as shown in FIG. 12.

The face view of the chuck 500 shown in FIG. 13 includes an inductive heater 575 as part of the heat exchanger. In general, the inductive heater 575, which includes a coil, receives an electrical current. Generally, the frequency of the electrical current is in an approximate range of 800 hertz (Hz) to 4 kilohertz (KHz). When the electrical current is input to the induction heater 575, the field, induced by the coils of the inductive heater 575, generates eddy currents on the plate of the HCA 505, which in turn, cause heat to emanate from the plate. In one embodiment that includes an induction heater in the HCA, the HCA 505 also contains one or more channels for conducting fluids through the heat exchanger. The inlet and outlet for a first set of channels is shown as inductive heater coolant inlet 525 and inductive heater coolant outlet 530 on FIG. 12. The channels are used to control cooling of the inductive heater 575. The inductive heater 575 is intended to represent a broad category of heating elements that generate heat through an inductive coil, which are well known in the art and will not be described further.

The heating and cooling apparatus (HCA) of the present invention also has application for use in a manual testing machine. In general, a manual testing machine does not utilize a handler to transport the DUT. Instead, the device is manually placed in a test socket for testing. For implementation in a manual testing machine, the HCA, in one embodiment, is coupled to the test socket. In a second embodiment, the HCA is configured such that the HCA is thermally coupled to the back of the DUT.

Although the present invention has been described in view of the embodiments shown by the accompanying drawings, it should be appreciated that the invention is not limited solely to these specific embodiments. Therefore, it should be understood that various modifications can be made to the described embodiments and that new embodiments may be found and still fall within the scope of the present invention as defined by the appended claims.

What is claimed is:

1. An apparatus for precisely varying a temperature of a device under test (DUT), comprising:
   a plate having a surface area configured to couple to the DUT to transfer heat to and from the DUT by way of conduction; and
   a heat exchanger coupled to the plate to dynamically set a temperature of the surface area of the plate to one of a range of temperatures by way of conduction, the heat exchanger comprising a plurality of channels for circulating a plurality of fluids simultaneously, each fluid having a different nominal temperature and a flow rate that is adjustable to vary the temperature of the surface area of the plate, said channels being arranged relative to one another to promote a substantially uniform temperature across the surface area of the plate, whereby the temperature of the DUT is variable when the DUT is coupled to surface area of the plate.

2. The apparatus of claim 1, wherein the plurality of fluids comprises a first fluid having a first temperature that specifies a lower bound of the range of temperatures and a second fluid having a second temperature that specifies an upper bound of the range of temperatures.

3. The apparatus of claim 1, wherein the heat exchanger is recuperative.

4. The apparatus of claim 1, wherein the first channels and the second channels are arranged relative to one another to promote a substantially uniform temperature across the surface area of the plate.

5. The apparatus of claim 4, wherein the first channels and the second channels are interdigitated.

6. The apparatus of claim 1, wherein the heat exchanger comprises a body having more than two channels formed therein, wherein the channels are arranged relative to one another to promote a substantially uniform temperature across the surface area of the plate.

7. The apparatus of claim 1, further comprising a control circuit that controls the flow rates of the plurality of fluids to vary the temperature of the surface area of the plate.

8. The apparatus of claim 7, wherein the control circuit varies the temperature of the surface area of the plate by independently switching the flow rates of the plurality of fluids between a corresponding minimum flow rate and a corresponding maximum flow rate for each fluid.

9. The apparatus of claim 7, further comprising a temperature sensor coupled to sense the temperature of the DUT, the temperature sensor being coupled in a feedback arrangement with the control circuit such that control circuit adjusts the flow rates of the fluids in response to the temperature of the DUT.

10. The apparatus of claim 9, wherein the DUT comprises a self heating DUT such that the control circuit adjusts the flow rates of the fluids in response to the self heating DUT.

11. The apparatus of claim 1, wherein the DUT comprises a packaged semiconductor device and the apparatus is integrated into a package handler of a test system.

12. The apparatus of claim 1, wherein the DUT comprises a die of a semiconductor wafer and the apparatus is integrated into a wafer prober chuck of a test system.

13. The apparatus of claim 1, wherein the DUT comprises a packaged semiconductor device and the apparatus is integrated into a test head test socket of a test system.

14. The apparatus of claim 1, wherein the DUT comprises a die of a semiconductor wafer and the apparatus is integrated into a prober of a test system.

15. The apparatus of claim 1, wherein the apparatus is integrated into a manual machine testing system.

16. A test system comprising:

a handler that handles and positions a device under test (DUT); and automatic test equipment (ATE) that tests the DUT, wherein one of the handler and the ATE includes a heating and cooling apparatus that sets an operating temperature of the DUT to a plurality of different temperatures while testing the DUT, the heating and cooling apparatus comprising a plate having a surface area configured to receive the DUT and a heat exchanger comprising a plurality of channels arranged relative to one another to promote a substantially uniform temperature across the surface area of the plate to set a temperature of the surface area of the plate to the plurality of different temperatures by varying flow rates of a plurality of fluids circulated simultaneously by the heat exchanger, said channels being arranged relative to one another to promote a substantially uniform temperature across the surface area of the plate, whereby multiple passes of the handler are eliminated.

17. An apparatus for varying a temperature of a device under test (DUT), comprising:

a plate having a surface area configured to couple to the DUT to transfer heat to and from the DUT by way of conduction; and a body having a set of channels formed therein connected to the plate to set a temperature of the surface area of the plate to one of a range of temperatures by way of conduction, the set of channels circulating a plurality of fluids simultaneously, each fluid having a different nominal temperature and a flow rate that is adjustable to vary the temperature of the surface area of the plate, whereby the temperature of the DUT is variable when the DUT is coupled to surface area of the plate.

18. A test system comprising:

a handler that handles and positions a device under test (DUT);

automatic test equipment (ATE) for testing the DUT, wherein one of the handlers and the ATE include a heating and cooling apparatus that sets an operating temperature of the DUT to a plurality of different temperatures while testing the DUT, the heating and cooling apparatus comprising:

a temperature sensor coupled to said heating and cooling apparatus for determining an approximate temperature of said DUT; and a control circuit for setting a temperature of the heating and cooling apparatus to a predetermined delta value from the set point temperature at a first point in time in order to set the temperature of the DUT to the set point temperature, said control circuit coupled to said temperature sensor for setting the temperature of the heating and cooling apparatus to the set point temperature when the temperature of the DUT is approximately the set point temperature, whereby the DUT is rapidly slewed to the set point temperature.

19. An apparatus for rapidly setting a temperature of a device under test (DUT) to a set point temperature, comprising:

heating and cooling apparatus coupled to the DUT to vary the temperature of the DUT during testing to at least one set point temperature;

a temperature sensor coupled to said heating and cooling apparatus for determining an approximate temperature of said DUT; and a control circuit coupled to said heating and cooling apparatus for setting a temperature of the heating and cooling apparatus to a predetermined delta value from the set point temperature at a first point in time in order to set the temperature of the DUT to the set point temperature, said control circuit coupled to said temperature sensor for setting the temperature of the heating and cooling apparatus to the set point temperature when the temperature of the DUT is approximately the set point temperature, whereby the DUT is rapidly slewed to the set point temperature.

20. The test system of claim 19, wherein the DUT comprises a self heating DUT.

21. A method for rapidly setting a temperature of a device under test (DUT) to a set point temperature, comprising:

coupling the DUT to a heating and cooling apparatus that varies the temperature of the DUT during testing;

setting a temperature of the heating and cooling apparatus to a predetermined delta value from the set point temperature in response to determining that the DUT is to be set to the set point temperature; and setting the temperature of the heating and cooling apparatus to the set point temperature when the temperature of the DUT is approximately the set point temperature.

22. The method of claim 21, wherein the step of setting a temperature of the heating and cooling apparatus to a predetermined delta value from the set point temperature comprises the step of setting a temperature of the heating and cooling apparatus to a predetermined delta value above the set point temperature to rapidly heat the DUT.

23. The method of claim 21, wherein the step of setting a temperature of the heating and cooling apparatus to a predetermined delta value from the set point temperature comprises the step of setting a temperature of the heating and cooling apparatus to a predetermined delta value below the set point temperature to rapidly cool the DUT.

* * * * *